(12) United States Patent
Oh

(10) Patent No.: US 6,417,549 B1
(45) Date of Patent: Jul. 9, 2002

(54) STATIC RANDOM ACCESS MEMORY DEVICE AND METHOD FOR MANUFACTURING THE SAME

(75) Inventor: Chang-bong Oh, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/660,571

(22) Filed: Sep. 13, 2000

(30) Foreign Application Priority Data

Jan. 12, 2000 (KR) .............................................. 00-1338

(51) Int. Cl.[7] .............................................. H01L 29/72
(52) U.S. Cl. ...................... 257/401; 257/288; 257/314; 365/63; 365/154; 365/190; 365/203; 365/205; 365/207; 365/208; 365/233
(58) Field of Search ................................ 257/401, 288, 257/314; 365/63, 203, 205, 207, 208, 190, 233, 154

(56) References Cited

U.S. PATENT DOCUMENTS 5,965,922 A * 10/1999 Matsui ........................ 257/369

* cited by examiner

Primary Examiner—Edward Wojciechowicz
(74) Attorney, Agent, or Firm—Mills & Onello LLP

(57) ABSTRACT

A static random access memory (SRAM) device and a method for manufacturing the same are disclosed. In the SRAM device including a flip-flop circuit including two access transistors and a pair of inverters, connection lines for connecting the inputs and outputs of the inverters, and a word line, power supply lines and bit lines are formed of a metal interconnection. The resistance of interconnection can be reduced and the SRAM device manufacturing process can be performed along with CMOS standard logic manufacturing process.

25 Claims, 24 Drawing Sheets

STATIC RANDOM ACCESS MEMORY DEVICE AND METHOD FOR MANUFACTURING THE SAME

BACKGROUND OF THE INVENTION

1. Field of the Invention

The present invention relates to a semiconductor device and a method for manufacturing the same, and more particularly, to a static random access memory device (SRAM) which can be manufactured by a CMOS standard logic manufacturing process and a method for manufacturing the same.

2. Description of the Related Art

Static random access memories (SRAMs) are easy to use and operate faster compared to dynamic random access memories (DRAM). For these reasons, the SRAMs have been used typically as a cache memory or a system memory in terminals. Recently, a development tendency of semiconductor devices towards high performance and composite functionality has raised use of SRAM embedded logic products, in which SRAMs and logic products are merged in one chip.

Referring to FIG. 1, an equivalent circuit diagram of a unit memory cell of a general SRAM device is shown. As shown in FIG. 1, the SRAM cell is composed of two access transistors Q1 and Q2 and a flip-flop circuit including a pair of CMOS inverters. The first inverter is composed of transistors Q5 and Q3, and the second inverter is composed of transistors Q6 and Q4. SRAM cells are classified into one of three types including a resistor type SRAM, a thin film transistor type SRAM and a pull CMOS type SRAM, according to the type of load transistors, i.e., transistors Q5 and Q6, of the flip-flop. Recently, the increasing need for low power supply voltage and high-speed products has raised interest in the full CMOS type SRAM.

However, as shown in FIG. 1, the full CMOS SRAM requires six transistors Q1 through Q6 and twelve nodes C1 through C12 to constitute one memory cell. Thus, it has high cell area, resulting in the disadvantage of less integration density, compared to the other two types of cells, which require only four transistors.

In FIG. 1, the first access transistor Q1 and the second access transistor Q2 have their gates connected respectively via the nodes C9 and C10 to a word line WL, and their sources connected respectively via the nodes C7 and C8 to first and second bit lines BL1 and BL2. The first CMOS inverter, which is composed of the first load transistor Q5 and the first drive transistor Q3, has an input connected via nodes C4 and C2, respectively, to the output of the second CMOS inverter and the drain of the second access transistor Q2, and an output connected via the nodes C1 and C3, respectively, to the drain of the first access transistor Q1 and the input (i.e., the node C6) of the second CMOS inverter. The second CMOS inverter, which is composed of the second load transistor Q6 and the second drive transistor Q4, has an input (i.e., the node C6) connected via the nodes C3 and C1, respectively, to the output of the first CMOS inverter and the drain of the first access transistor Q1, and an output connected via the nodes C2 and C4, respectively, to the drain of the second access transistor Q2 and the input (i.e., the node C5) of the first CMOS inverter. Also, the drains of the first and second load transistors Q5 and Q6 are connected via the node C12 to a first power supply voltage Vcc, and the sources of the first and second drive transistors Q3 and Q4 are connected via the node C11 to a second power supply voltage Vss.

FIG. 2 is a sectional view showing part of the conventional full CMOS type SRAM cell of FIG. 1, in which the input of the first CMOS inverter (the node C5 formed on the gate of the first load transistor Q5), the source 16 of the second load transistor Q6 and the drain 18 of the second access transistor Q2 (which shares the drain 18 with the second drive transistor Q4) are connected via the nodes C4 and C2 by a local interconnection line 22.

In FIG. 2, reference numeral 10 represents a semiconductor substrate, reference numeral 12 represents a field oxide layer, reference numeral 14 represents the gate of the first load transistor Q5, reference numeral 16 represents the source of the second load transistor Q6, reference numeral 18 represents the drain of the second access transistor Q2 and the second drive transistor Q4, reference numeral 20 represents an insulating layer, reference numeral 22 represents the local interconnection line, reference numeral 24 represents a first interlayer dielectric (ILD) film, reference numeral 26 represents a word line, reference numeral 28 represents a second ILD film, reference numeral 30 represents a power supply line, reference numeral 32 represents a third ILD film, and reference numeral 34 represents a bit line.

The input (refer to the gate 14 of the first load transistor Q5) of the first CMOS inverter is connected via the first local interconnection line, which is formed of a bilayer including a titanium (Ti) layer and a titanium nitride (TiN) layer, to the source 16 of the second load transistor Q6 and the drain 18 of the second access transistor Q2 and the second drive transistor Q4. The input (not shown) of the second CMOS inverter is connected via a second local interconnection line (not shown) to the source (not shown) of the first load transistor Q5 and the drain (not shown) of the first access transistor Q1 and the first drive transistor Q3.

The word line 26 is connected to the gates of the first and second access transistors Q1 (not shown) and Q2. The power supply line 30 and the bit lines are formed in different layers with a metal interconnection. In FIG. 2, the power supply line 30 extends in the lateral direction and the bit line 34 extends in the vertical direction.

Merging the SRAM cell of FIG. 2 with a logic device requires additional processes based on a general CMOS standard logic manufacturing process, thereby increasing the manufacturing cost due to the need for additional photolithography processes and making the overall process complicated. In particular, as shown in FIG. 2, for the connection between the input of the first CMOS inverter and the output of the second CMOS inverter, and between the output of the second CMOS inverter and the input of the first CMOS inverter, the conventional full CMOS type SRAM requires the formation of the local interconnection line having a bilayer structure including, for example, a Ti layer and a TiN layer, in addition to the general CMOS standard logic manufacturing process, and in turn additional masks therefor.

The word line 26 is formed of polyslicon, which is also used in forming the gate of the load transistor Q5. However, similar to the formation of the local interconnection line, additional processes in addition to the general CMOS standard logic manufacturing process must be carried out for the word line 26. Two more masks, one for the word line and the other for the contact hole connecting the word line and a transistor, are required, rendering the manufacturing process complicated.

Also, when the SRAM cell of FIG. 2 is merged with a logic device without performing additional processes, the size of the SRAM cell increases beyond a desired size.

SUMMARY OF THE INVENTION

To solve the above problems, it is an object of the present invention to provide a static random access memory (SRAM) device which can be manufactured by standard CMOS logic manufacturing processes without the need for additional masks or processes, wherein an increase in cell size is minimized.

Another object of the present invention is to provide a method for manufacturing an SRAM device by standard CMOS logic manufacturing processes without the need for additional masks or processes, wherein an increase in cell size is minimized.

The first object is achieved by a SRAM device comprising: first and second access transistors each having a gate connected to a word line and a source connected to a bit line. The SRAM also includes a first inverter including a first drive transistor and a first load transistor and a second inverter including a second drive transistor and a second load transistor. A first connection line connects the input of the first inverter, the output of the second inverter and the drain of the second access transistor. A second connection line connects the input of the second inverter, the output of the first inverter and the drain of the first access transistor. In the device of the invention, all conductive layers, other than the gates of the two access transistors and the gates of the transistors for the first and second inverters, are formed of metal in different layers.

In one embodiment, the multiple metal layers include a first metal layer which forms the first and second connection lines, a second metal layer which forms the word line, and a third metal layer which forms bit lines and power supply lines connected to the first and second inverters.

In one embodiment, the multiple metal layers include a first metal layer which forms the first and second connection lines, a second metal layer which forms the word line, a third metal layer which forms bit lines, and a fourth metal layer which forms power supply lines connected to the first and second inverters.

In another aspect, the SRAM device according to the present invention includes a flip-flop circuit including two access transistors and a pair of inverters. The SRAM device comprises a semiconductor substrate in which parallel first and second active regions of a first conductive type are arranged and third and fourth active regions of a second conductive type are arranged between the first and second active regions. First conductive layers act as the gates of the first access transistor and the first drive transistor which extend perpendicular to the first active region for serial connection between the first access and drive transistors, as the gates of the second access transistor and the second drive transistors which extend perpendicular to the second active region for serial connection between the second access and drive transistors, as the gate of the first load transistor which extends perpendicular to the third active region, and as the gate of the second load transistor which extends perpendicular to the fourth active region. Second conductive layers act as a first connection line which connects the drain of the first access transistor and the first drive transistor, the gate of the second drive transistor, the gate of the second load transistor connected to the gate of the second drive transistor, and the source of the first load transistor, and as a second connection line which connects the drain of the second access transistor and the second drive transistor, the gate of the first drive transistor, the gate of the first load transistor connected to the gate of the first drive transistor, and the source of the second load transistor. A third conductive layer acts as a word line connected to the gate of the first access transistor and the gate of the second access transistor. Fourth conductive layers act as a first power supply line connected to the drain of the first load transistor and the drain of the second load transistor, as a second power supply line connected to the source of the first drive transistor and the source of the second drive transistor, as a first bit line connected to the source of the first access transistor, and as a second bit line connected to the source of the second access transistor.

In one embodiment of this aspect of the invention, the first and second active regions are formed across a cell in a bar shape, and the third and fourth active regions are arranged in a staggered manner parallel to the first and second active regions. The first active region can have a wider width at regions overlapped by the gate of the first drive transistor than at regions overlapped by the gate of the first access transistor, and the second active region can have a wider width at regions overlapped by the gate of the second drive transistor than at regions overlapped by the gate of the second access transistor.

In addition, in one embodiment of this aspect of the invention, the gate of the first drive transistor arranged perpendicular to the first active region and the gate of the first load transistor arranged perpendicular to the third active region are laterally connected to cover one end of the fourth active region, and the gate of the second drive transistor arranged perpendicular to the second active region and the gate of the second load transistor arranged perpendicular to the fourth active region are laterally connected to cover one end of the third active region.

The gate of the first access transistor, the gate of the second drive transistor and the gate of the second load transistor can be located in a line, and the gate of the second access transistor, the gate of the first drive transistor and the gate of the first load transistor can be located in another line parallel to the gates of the first access transistor, second drive transistor and second load transistor.

The first connection line and the second connection line can be arranged, not overlapping each other, and the elements connected to the second connection line are not overlapped by the first connection line, and the elements connected to the first connection line are not overlapped by the second connection line.

The first connection line can connect the drain of the first access transistor and the first drive transistor, the gate of the second drive transistor, the gate of the second load transistor, and the source of the first load transistor via a contact hole C1/C3 formed on the drain of the first access transistor and the first drive transistor and a contact hole C6 formed over the gate of the second load transistor overlapped by the one end of the third active region, and the source of the first load transistor, and the second connection line can connect the drain of the second access transistor and the second drive transistor, the gate of the first drive transistor, the gate of the first load transistor and the source of the second load transistor via a contact hole C2/C4 formed on the drain of the second access transistor and the second drive transistor and a contact hole C5 formed over the gate of the first load transistor overlapped by one end of the fourth active region, and the source of the second load transistor. The first and second connection lines can be formed of polysilicon, amorphous silicon, aluminum (Al), tungsten (W), titanium (Ti), cobalt (Co) or copper (Cu).

The word line can be connected to a first pad layer C9 which is formed of the first conductive layer and is connected to the gate of the first access transistor, and a first pad layer C10 which is formed of the first conductive layer and is connected to the gate of the second access transistor. The word line may be arranged parallel to the gates of the transistors and across a cell in a bar shape.

In one embodiment, the first power line, the second power line, the first bit line and the second bit line are arranged perpendicular to the word line. The first power supply line can be arranged between and parallel to the first and second bit lines, and the second power supply lines can be arranged between and parallel to the first and second bit lines between which the first power supply line is not formed.

The first power supply line can supply the supplying power supply voltage to the drains of the first and second load transistors, respectively, via a first pad layer C12 formed of the second conductive layer over the drain of the first load transistor and via a second pad layer C12 formed of the third conductive layer over the drain of the second load transistor. The second power supply line can supply ground voltage to the sources of the first and second drive transistors, respectively, via a first pad layer C11 formed of the second conductive layer over the source of the first drive transistor and via a second pad layer C11 formed of the third conductive layer over the source of the second drive transistor. The first bit line can supply a bit line or bit line bar voltage to the source of the first access transistor via a first pad layer C7 formed of the second conductive layer and a first pad layer C7 formed of the third conductive layer over the source of the first access transistor. The second bit line can supply a bit line bar or bit line voltage to the source of the second access transistor via a first pad layer C8 formed of the second conductive layer and a second pad layer C8 formed of the third conductive layer over the source of the second access transistor.

In one embodiment, the second through fourth conductive layers are a metal layer.

In another aspect of the invention, there is provided an SRAM including a flip-flop circuit including two access transistors and a pair of inverters. The device includes a semiconductor substrate in which parallel first and second active regions of a first conductive type are arranged and third and fourth active regions of a second conductive type are arranged between the first and second active regions. First conductive layers act as (i) the gates of the first access transistor and the first drive transistor which extend perpendicular to the first active region for serial connection between the first access and drive transistors, (ii) the gates of the second access transistor and the second drive transistors which extend perpendicular to the second active region for serial connection between the second access and drive transistors, (iii) the gate of the first load transistor which extends perpendicular to the third active region, and (iv) the gate of the second load transistor which extends perpendicular to the fourth active region. Second conductive layers formed of a metal layer act as a first connection line which connects the drain of the first access transistor and the first drive transistor, the gate of the second drive transistor, the gate of the second load transistor connected to the gate of the second drive transistor, and the source of the first load transistor, and as a second connection line which connects the drain of the second access transistor and the second drive transistor, the gate of the first drive transistor, the gate of the first load transistor connected to the gate of the first drive transistor, and the source of the second load transistor. A third conductive layer formed of a metal layer acts as a word line connected to the gate of the first access transistor and the gate of the second access transistor. Fourth conductive layers formed of a metal layer act as a first bit line connected to the source of the first access transistor and as a second bit line connected to the source of the second access transistor. Fifth conductive layers formed of a metal layer act as a first power supply line connected to the drain of the first and second load transistors, and as a second power supply line connected to the source of the first and second drive transistors.

The second object is achieved by a method for manufacturing a static random access memory (SRAM) device including a flip-flop including two access transistors and a pair of inverters. In accordance with the method, first and second active regions are defined in a semiconductor substrate parallel to each other, and third and fourth active regions are simultaneously arranged between the first and second active regions parallel to each other. A gate oxide layer is formed on the substrate having the first through fourth active regions, and the gates of the first access transistor and the first drive transistor are formed perpendicular to the first active region for serial connection between the first access transistor and the first drive transistor. The gates of the second access transistor and the second drive transistor are formed perpendicular to the second active region for serial connection between the second access transistor and the second drive transistor. The gate of the first load transistor is formed perpendicular to the third active region, and the gate of the second load transistor is formed perpendicular to the fourth active region. Then, a first interlayer dielectric (ILD) film is formed on the substrate having the gates of the transistors, and the first ILD film is selectively etched to form (i) a contact hole C1/C3 over the drain of the first access transistor and the first drive transistor, (ii) a contact hole C6 over the gate of the second load transistor and the source of the first load transistor connected to the gate of the second drive transistor, (iii) a contact hole C2/C4 over the drain of the second access transistor and the first drive transistor, and (iv) a contact hole C5 over the gate of the first load transistor and the source of the second load transistor connected to the gate of the first drive transistor. A second conductive layer is formed and selectively patterned to form a first connection line for connecting the drains of the first access transistor and first drive transistor, the gates of the second drive transistor and second load transistor, and the source of the first load transistor via the contact holes C1/C3 and C6 and to form a second connection line for connecting the drains of the second access transistor and second drive transistor, the gates of the first drive transistor and first load transistor, and the source of the second load transistor via the contact holes C2/C4 and C5. Then, a second ILD film is formed and then selectively patterned to form a first via hole C9 over the gate of the first access transistor and a first via hole C10 over the gate of the second access transistor. A third conductive layer is formed and then selectively patterned to form a word line connected to the gates of the first access transistor and the second access transistor via the first via holes C9 and C10, respectively. A second ILD film is formed and selectively patterned to form a second via hole C12 over the drain of the first and second load transistors, a second via hole C11 over the source of the first and second drive transistors, a second via hole C7 over the source of the first access transistor, and a second via hole C8 over the source of the second access transistor. Then, a fourth conductive layer is formed and selectively patterned to form a first power supply line connected to the drain of the first and second load transistors via the second via hole C12, a second power supply line connected to the source of the first and second drive transistors via the second via hole C11, a first bit line connected to the source of the first access transistor via the second via hole C7, and a second bit line connected to the source of the second access transistor via the second via hole C8.

In one embodiment of this aspect, the first and second active regions are formed across a cell in a bar shape. The third and fourth active regions can be arranged in a staggered manner parallel to the first and second active regions.

In one embodiment, the first active region has a wider width at regions overlapped by the gate of the first drive transistor than at regions overlapped by the gate of the first access transistor. The second active region has a wider width at regions overlapped by the gate of the second drive transistor than at regions overlapped by the gate of the second access transistor.

In one embodiment, in forming the contact holes in the first ILD film along with the contact holes C/C3, C2/C4, C5 and C6, contact holes C7 and C9 are respectively formed over the source and gate of the first access transistor, contact holes C11 are formed over the sources of the first and second drive transistors, contact holes C8 and C10 are respectively formed over the source and gate of the second access transistor, and contact holes C12 are formed over the drains of the first and second load transistors.

In one embodiment, before forming the second conductive layer, tungsten is deposited to fill the contact holes C1/C2, C2/C4, C5 and C6. The tungsten layer is planarized until the surface of the first ILD film is exposed, to form a first plug C1/C3 filling the contact hole C1/C3, a first plug C2/C4 filling the contact hole C2/C4, a first plug C5 filling the contact hole C5, and a first plug C6 filling the contact plug C6. Here, along with the first plugs C1/C3, C2/C4, C5 and C6, first plugs C7 and C9 can be respectively formed in the contact holes C7 and C9 formed respectively over the source and gate of the first access transistor, first plugs C11 can be formed in the contact holes C11 formed respectively over the sources of the first and second drive transistors, first plugs C8 and C10 can be respectively formed in the contact holes C8 and C10 formed respectively over the source and gate of the second access transistor; and first plugs C12 can be formed in the contact holes C12 formed over the drains of the first and second load transistors.

In one embodiment, in patterning the second conductive layer along with the first and second connection lines a first pad layer C7 connected to the first plug C7, a first pad layer C9 connected to the first plug C9, a first pad layer C11 connected to the first plug 11, a first pad layer C8 connected to the first plug C8, a first pad layer C10 connected to the first plug C10, and a first pad layer C12 connected to the first plug C12 are formed. The second conductive layer can be formed of polysilicon, amorphous silicon, aluminum (Al), tungsten (W), titanium (Ti), cobalt (Co) or copper (Cu), and the third and fourth conductive layers can be formed of Al or Cu.

The contact holes, the first via holes and the second via holes can be filled with tungsten to form first plugs, second plugs and third plugs, respectively.

In defining the active regions, each step for forming fourth conductive layers can be accompanied with general CMOS manufacturing process.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS OF THE INVENTION

Figure 1:
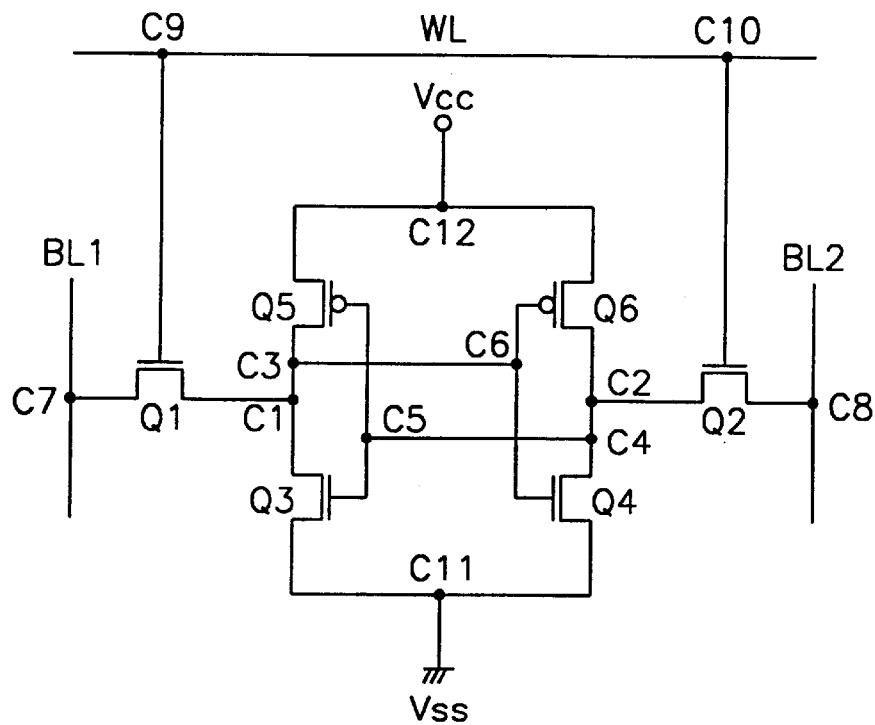
FIG. 1 is an equivalent circuit diagram of a unit cell of a general static random access memory (SRAM) device.

The present invention now will be described more fully with reference to the accompanying drawings. In the drawings, the thickness of layers and regions are exaggerated for clarity.

FIGS. 3 through 9 are layouts of exemplary mask patterns for use in manufacturing a static random access memory (SRAM) device by a standard CMOS logic manufacturing process without need for additional masks or processes, in accordance with an embodiment of the present invention. In particular, referring to FIG. 3, the layout of mask patterns for use in forming active regions and gates are shown. Reference symbol P10 represents the mask pattern for forming a first active region, reference symbol P12 represents the mask pattern for forming a third active region, reference symbol P14 represents the mask pattern for forming a fourth active region, reference symbols P16 represents the mask pattern for forming a second active region, reference symbol P18 represents the mask pattern for forming the gate of the first access transistor Q1, reference symbol P20 represents the mask pattern for forming the gate of the first drive transistor Q3 and the first load transistor Q5, reference symbol P22 represents the mask pattern for forming the gate of the second drive transistor Q4 and the second load transistor Q6, and reference symbol P24 represents the mask pattern for forming the gate of the second access transistor Q2.

As shown, the first and second active regions P10 and P16 for forming NMOS transistors are arranged parallel to each other in a bar shape, and the third and fourth active regions P12 and P14 for forming PMOS transistors are also arranged parallel to each other between the first and second active regions P10 and P16 in a staggered manner.

The gate P18 of the first access transistor Q1 is arranged to cross the first active region P10 and the gate P24 of the second access transistor Q2 is arranged to cross the second active region P16. The gate P20 of the first drive transistor Q3 arranged perpendicular to the first active region P10, and the gate P20 of the first load transistor Q5 arranged perpendicular to the third active region P12 are laterally connected, extending to cover one end of the fourth active region P14. Also, the gate P22 of the second drive transistor Q4 arranged perpendicular to the second active region P16, and the gate P22 of the second load transistor Q6 arranged perpendicular to the fourth active region P14 are laterally connected, extending to cover one end of the third active region P12. The gate P18 of the first access transistor Q1, the gate P22 of the second drive transistor Q4 and the gate P22 of the second load transistor Q6 are located on a line. Also, the gate P24 of the second access transistor Q2, the gate P20 of the first drive transistor Q3 and the gate P20 of the first load transistor Q5 are located on another line parallel to the gate P18 of the first access transistor Q1 and the gate P22 of the second drive transistor Q4 and the second load transistor Q6.

The width of the first active region P10 overlapped by the gate P18 of the first access transistor Q1 is greater than the width of the first active region P10 overlapped by the gate P20 of the first drive transistor Q3. The width of the second active region P16 overlapped by the gate P24 of the second access transistor Q2 is greater than the width of the second active region P16 overlapped by the gate P22 of the second drive transistor Q4.

Figure 4:
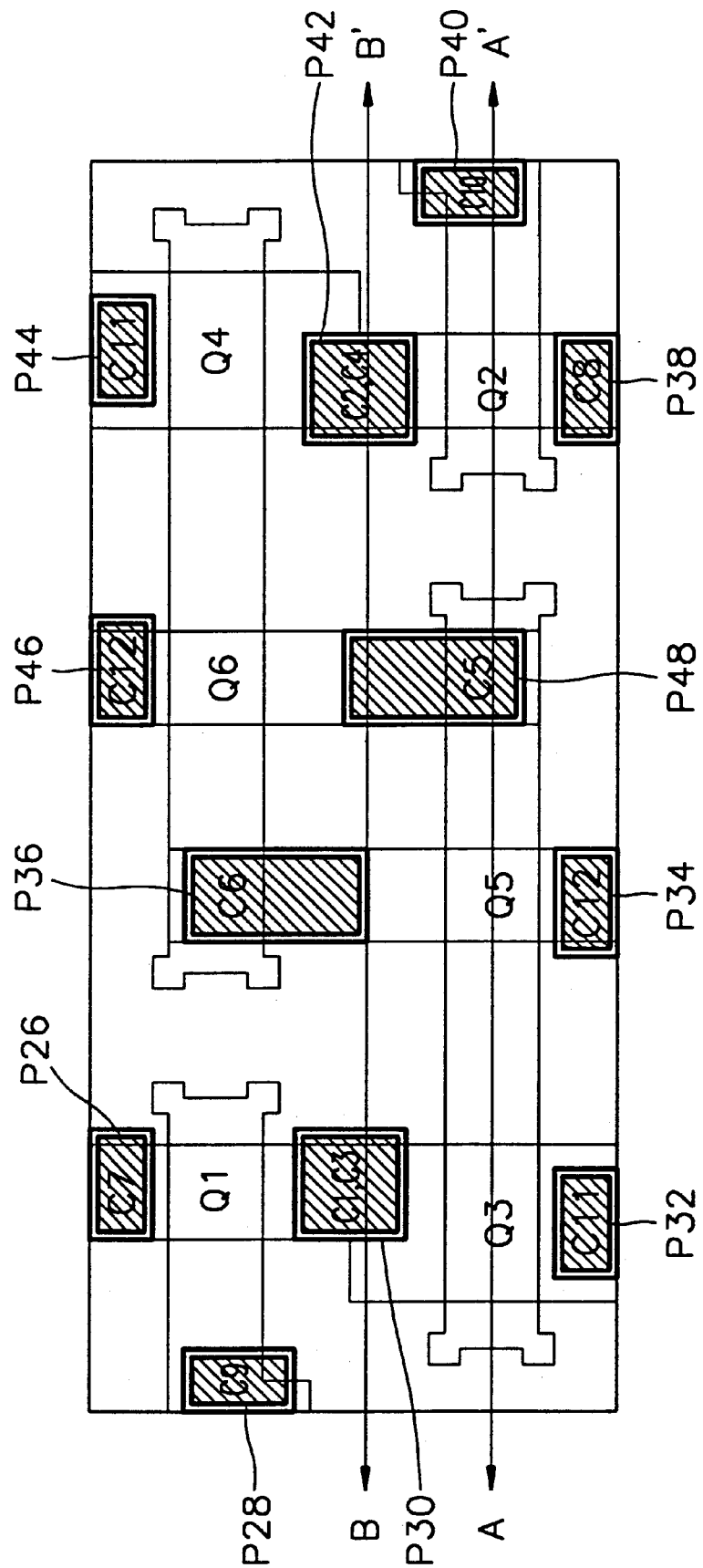

Referring to FIG. 4, the layout of mask patterns for forming contact holes is shown. In FIG. 4, reference symbol P26 represents the mask pattern for forming a contact hole C7 on the source of the first access transistor Q1; reference symbol P28 represents the mask pattern for forming a contact hole C9 on the gate of the first access transistor Q1; reference symbol P30 represents the mask pattern for forming a contact hole C1/C3 on the drain of the first access transistor Q1 and the first drive transistor Q3; reference symbol P32 represents the mask pattern for forming a contact hole C11 of the first inverter on the source of the first drive transistor Q3; reference symbol P34 represents the mask pattern for forming a contact hole 12 of the first inverter on the drain of the first load transistor Q5; reference symbol P36 represents the mask pattern for forming a contact hole C6 on the gates of the second load transistor Q6 and the second drive transistor Q4, and the source of the first load transistor Q5; reference symbol P38 represents the mask pattern for forming a contact hole C8 on the source of the second access transistor Q2; reference symbol P40 represents the mask pattern for forming a contact hole C10 on the gate of the second access transistor Q2; reference symbol P42 represents the mask pattern for forming a contact hole C2/C4 on the drain of the second access transistor Q2 and second drive transistor Q4; reference symbol P44 represents the mask pattern for forming a contact hole C11 of the second inverter on the source of the second drive transistor Q4; reference symbol P46 represents the mask pattern for forming a contact hole C12 of the second inverter, on the drain of the second load transistor Q6; and reference symbol P48 represents the mask pattern for forming a contact hole C5 on the gates of the first load transistor Q5 and the first drive transistor Q3 and the source of the second load transistor Q6.

The contact hole C1/C3 exposes both the drains of the first access transistor Q1 and the first drive transistor Q3; the contact hole C2/C4 exposes both the drains of the second access transistor Q2 and the second drive transistor Q4; the contact hole C5 exposes both the gates of the first drive transistor Q3 and the first load transistor Q5 and the source of the second load transistor Q6; and the contact hole C6 exposes both the gates of the second drive transistor Q4 and the second load transistor Q6 and the source of the first load transistor Q5.

Figure 5:
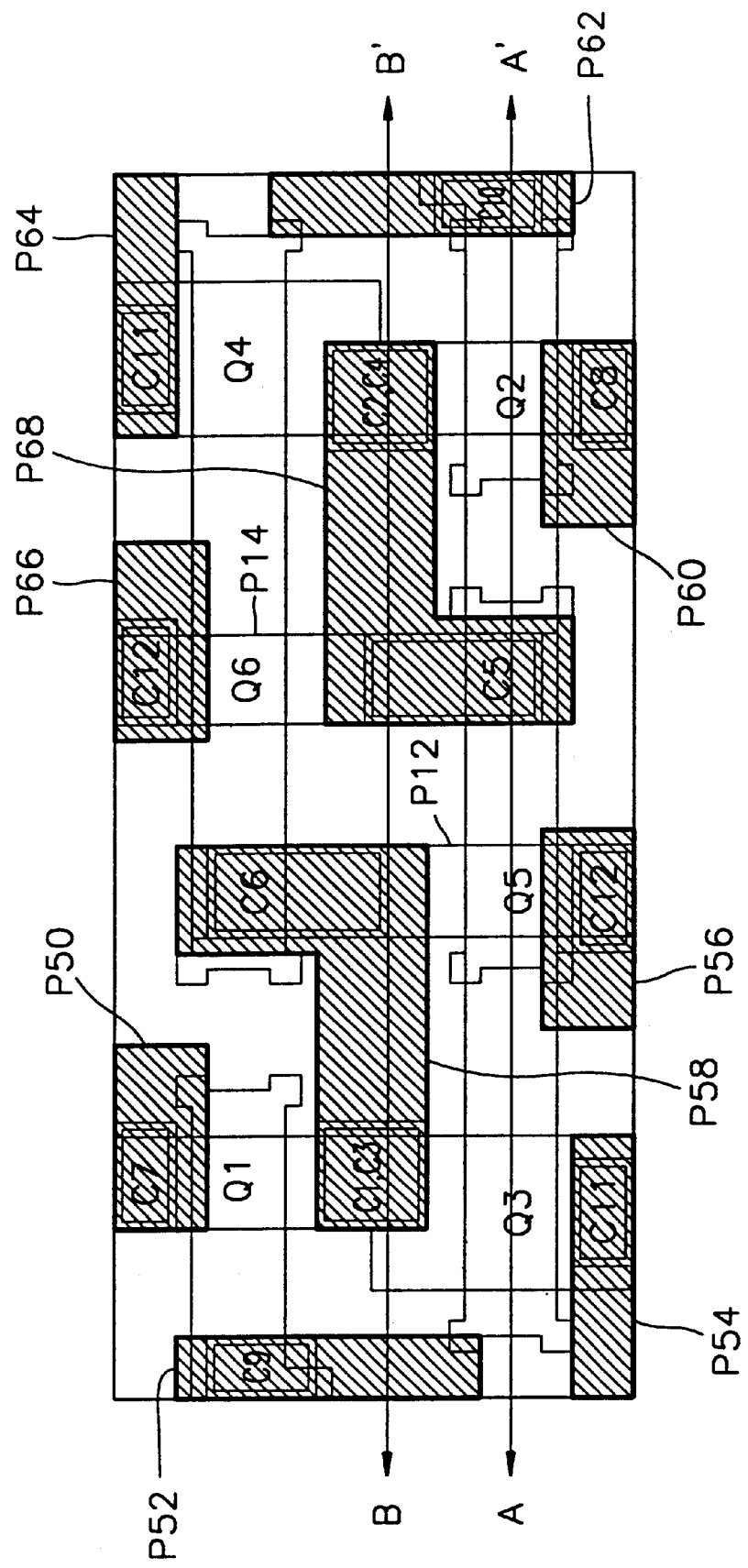

Referring to FIG. 5, the layout of mask patterns for forming a first connection line, a second connection line and a plurality of first pad layers is shown. In FIG. 5, reference symbol P50 represents the mask pattern for forming a first pad layer C7 connected via the contact hole C7 to the source of the first access transistor Q1; reference symbol P52 represents the mask pattern for forming a first pad layer C9 connected via the contact hole C9 to the gate of the first access transistor Q1; reference symbol P54 represents the mask pattern for forming a first pad layer C11 for the first inverter connected via the contact hole C11 for the first inverter to the source of the first drive transistor Q3; reference symbol P56 represents the mask pattern for forming another first pad layer C12 for the first inverter connected via the contact hole C12 for the first inverter to the drain of the first load transistor Q5; and reference symbol P58 represents the mask pattern for forming a first connection line for connecting the drains of the first access transistor Q1 and the first drive transistor Q3 with the gate of the second drive transistor Q4, the gate of the second load transistor Q6 and the source of the first load transistor Q5 via the contact holes C1/C3 and C6. Also, reference symbol P60 represents the mask pattern for forming a first pad layer C8 connected via the contact hole C8 to the source of the second access transistor Q2; reference symbol P62 represents the mask pattern for forming a first pad layer C10 connected via the contact hole C10 to the gate of the second access transistor Q2; reference symbol P64 represents the mask pattern for forming a first pad layer C11 for the second inverter connected via the contact hole C11 for the second inverter to the source of the second drive transistor Q4; reference symbol P66 represents the mask pattern for forming another first pad layer C12 for the second inverter connected via the contact hole C12 for the second inverter to the drain of the second load transistor Q6; and reference symbol P68 represents the mask pattern for forming a second connection line for connecting the drains of the second access transistor Q2 and the second drive transistor Q4 with the gate of the first drive transistor Q3, the gate of the first load transistor Q5 and the source of the second load transistor Q6 via the contact holes C2/C4 and C5.

The first connection line P58 and the second connection line P68 are arranged so as not to overlap each other. In other words, the elements connected to the second connection line P68, i.e., the drains of the second access transistor Q2 and the second drive transistor Q4, the gates of the first drive transistor Q3 and the first load transistor Q5, and the source of the second load transistor Q6 are not overlapped by the first connection line P58. Similarly, the elements connected to the first connection line P58, i.e., the drains of the first access transistor Q1 and the first drive transistor Q3, the gates of the second drive transistor Q4 and the second load transistor Q6 and the source of the first load transistor Q5 are not overlapped by the second connection line P68.

The first connection line P58 connects the contact holes C1/C3 and C6, wherein the contact hole C6 is formed over the gate of the second load transistor Q6 overlapped by the one end of the third active region P12 and the source of the first load transistor Q5. The second connection line P68 connects the contact holes C2/C4 and C5, wherein the contact hole C5 is formed over the gate of the first load transistor Q5 overlapped by the one end of the fourth active region P14 and the source of the second load transistor Q6.

Figure 6:
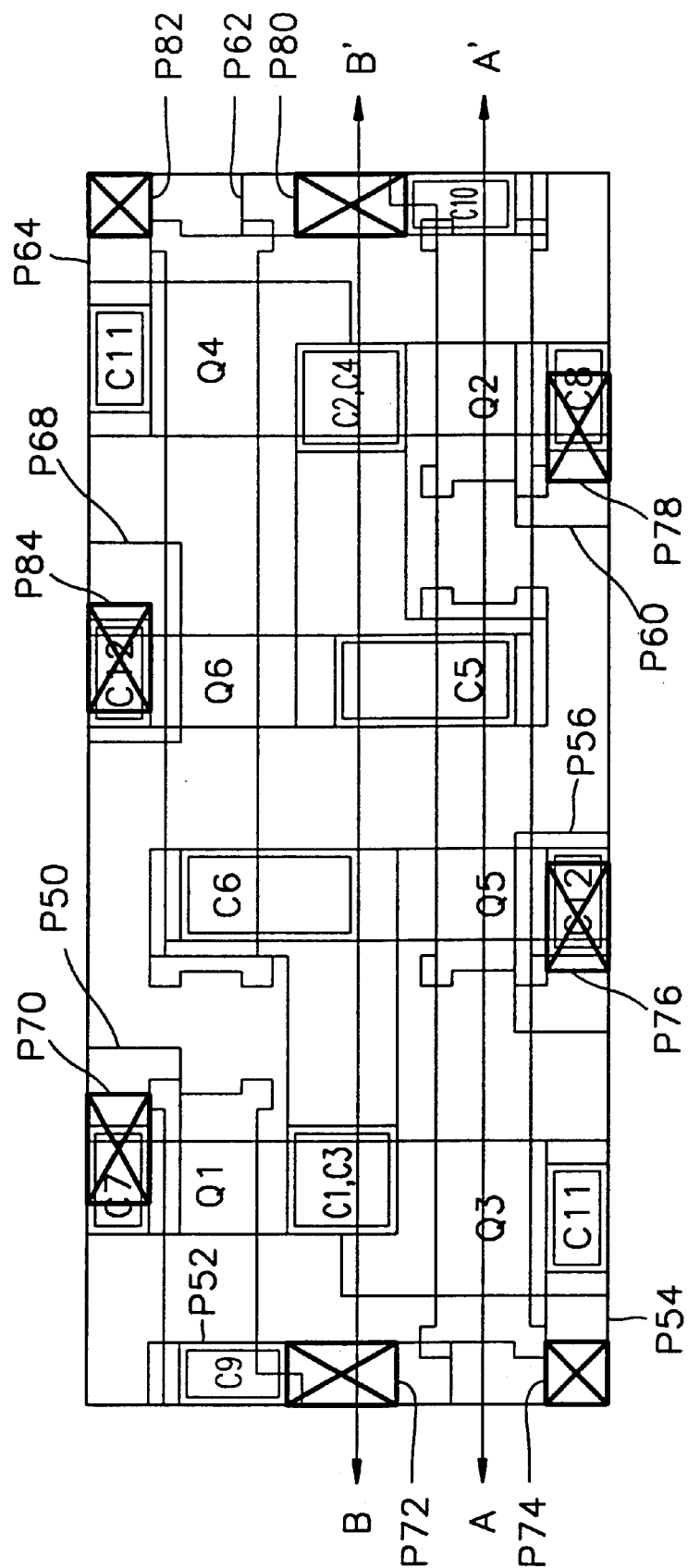

Referring to FIG. 6, the layout of mask patterns for forming a plurality of first via holes is shown. In FIG. 6, reference symbol P70 represents the mask pattern for forming a first via hole C7 on the first pad layer C7; reference symbol P72 represents the mask pattern for forming a first via hole C9 on the first pad layer C9; reference symbol P74 represents the mask pattern for forming a first via hole C11 for the first inverter on the first pad layer C11 for the first inverter; reference symbol P76 represents the mask pattern for forming another via hole C12 for the first inverter on the first pad layer C12 for the first inverter; reference symbol P78 represents the mask pattern for forming a first via hole C8 on the first pad layer C8; reference symbol P80 represents the mask pattern for forming a first via hole C10 on the first pad layer C10; reference symbol P82 represents the mask pattern for forming a first via hole C11 for the second inverter on the first pad layer C11 for the second inverter; and reference symbol P84 represents the mask pattern for forming another first via hole C12 for the second inverter on the first pad layer C12 for the second inverter.

Figure 7:
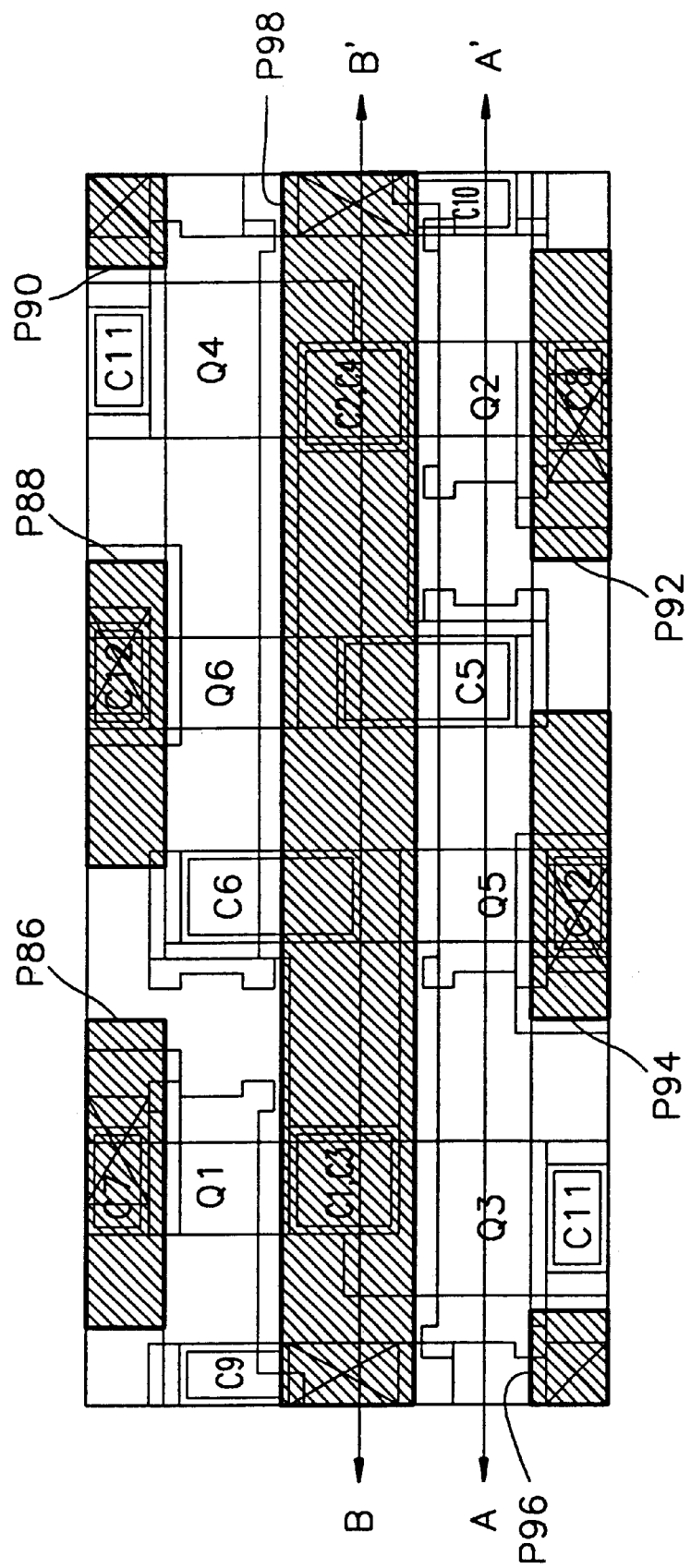

Referring to FIG. 7, the layout of mask patterns for forming a word line and a plurality of second pad layers is shown. In FIG. 7, reference symbol P86 represents the mask pattern for forming a second pad layer C7 connected via the first via hole C7 to the source of the first access transistor Q1, reference symbol P88 represents the mask pattern for forming a second pad layer C12 for the second inverter connected via the first via hole C12 for the second inverter to the drain of the second load transistor Q6, reference symbol P90 represents the mask pattern for forming a second pad layer C11 for the second inverter connected via the first via hole C11 for the second inverter to the source of the second drive transistor Q4, reference symbol P92 represents the mask pattern for forming a second pad layer C8 connected via the first via hole C8 to the source of the second access transistor Q2, reference symbol P94 represents the mask pattern for forming a second pad layer C12 for the first inverter connected via the first via hole C12 for the first inverter to the drain of the first load transistor Q5, reference symbol P96 represents the mask pattern for forming a second pad layer C11 for the first inverter connected via the first via hole C11 for the first inverter to the source of the first drive transistor Q3, and reference symbol P 98 represents the mask pattern for forming a word line connected via the first via holes C9 and C10 to the gates of the first access transistor Q1 and the second access transistor Q2. The word line P98, which extends across the cell in a bar shape, is arranged parallel to the gates of transistors.

Figure 8:
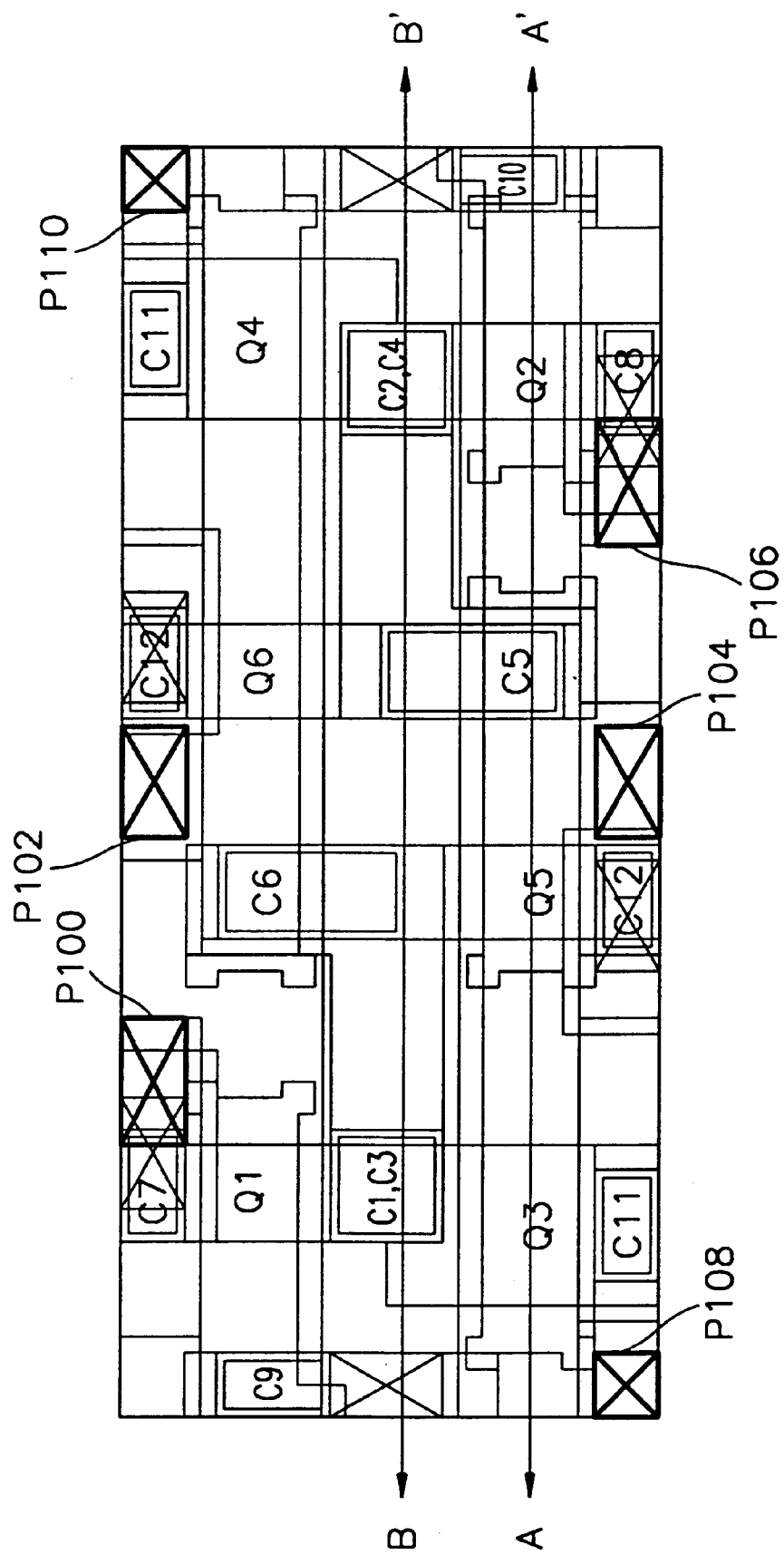

Referring to FIG. 8, the layout of mask patterns for forming a plurality of second via holes is shown. In FIG. 8, reference symbol P100 represents the mask pattern for forming a second via hole C7 on the second pad layer C7; reference numeral P102 represents the mask pattern for forming a second via hole C12 for the second inverter on the second pad layer C12 for the second inverter; reference numeral P104 represents the mask pattern for forming a second via hole C12 for the first inverter on the second pad layer C12 for the first inverter; reference numeral P106 represents the mask pattern for forming a second via hole C8 on the second pad layer C8, reference numeral P108 represents the mask pattern for forming a second via hole C11 for the first inverter on the second pad layer C11 for the first inverter; and reference numeral P110 represents the mask pattern for forming a second via hole C11 for the second inverter on the second pad layer C11 for the second inverter.

Figure 9:
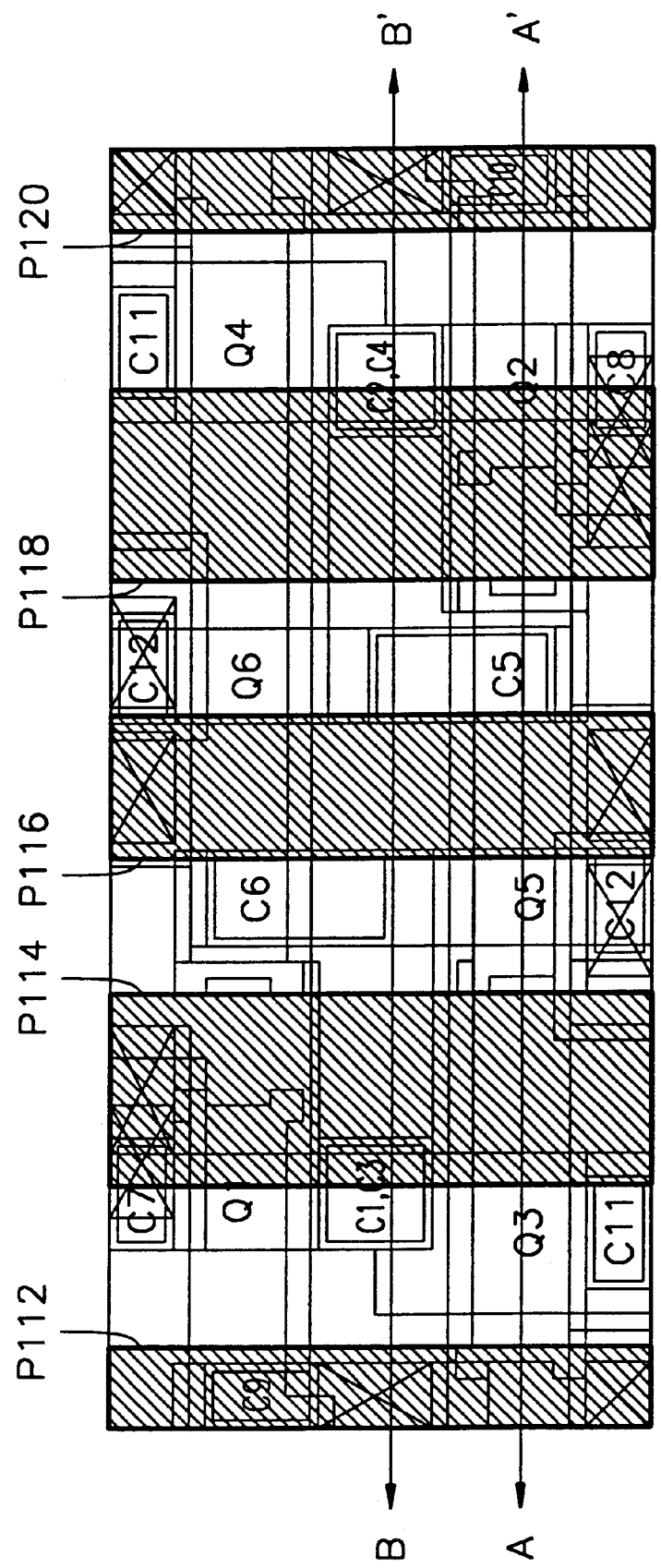

Referring to FIG. 9, the layout for mask patterns for forming power supply lines and bit lines is shown. In FIG. 9, reference symbol P112 represents the mask pattern for forming a second power supply line (i.e., for Vss) connected via the second via hole C11 for the first inverter to the source of the first drive transistor Q3; reference symbol P114 represents the mask pattern for forming a first bit line connected via the second via hole C7 to the source of the first access transistor Q1; reference symbol P116 represents the mask pattern for forming a first power supply line (i.e, for Vcc) connected via the second via hole C12 for the first inverter and the second via hole C12 for the second inverter respectively to the drain of the second load transistor Q6 and the drain of the first load transistor Q5; reference symbol P118 represents the mask pattern for forming a second bit line connected via the second via hole C8 to the source of the second access transistor Q2; reference symbol P120 represents the mask pattern for forming another second power supply line (i.e., for Vss) connected via the second via hole C11 for the second inverter to the source of the second drive transistor Q4.

Figure 10:
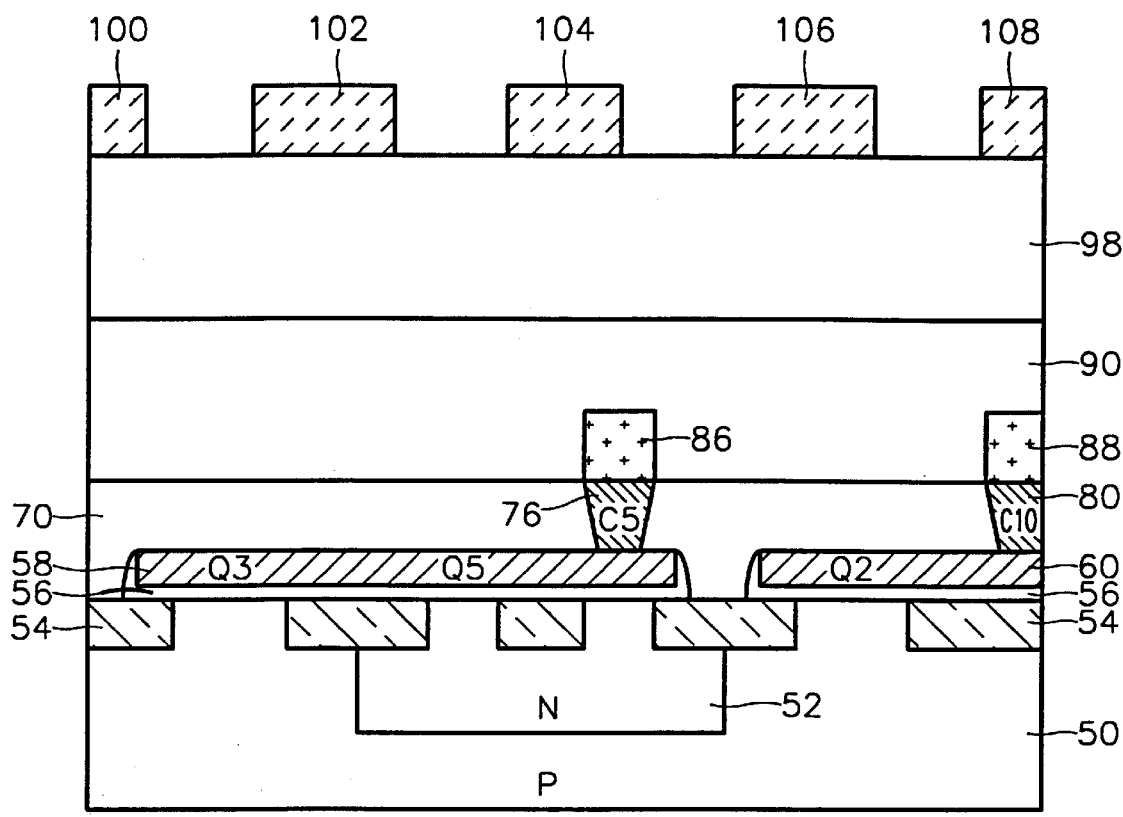
FIGS. 10 and 11 are sectional views taken along lines A–A' and B–B' in FIG. 9, respectively, of the embodiment of the SRAM device according to the present invention manufactured using the mask patterns of FIGS. 3 through 9.
Figure 11:
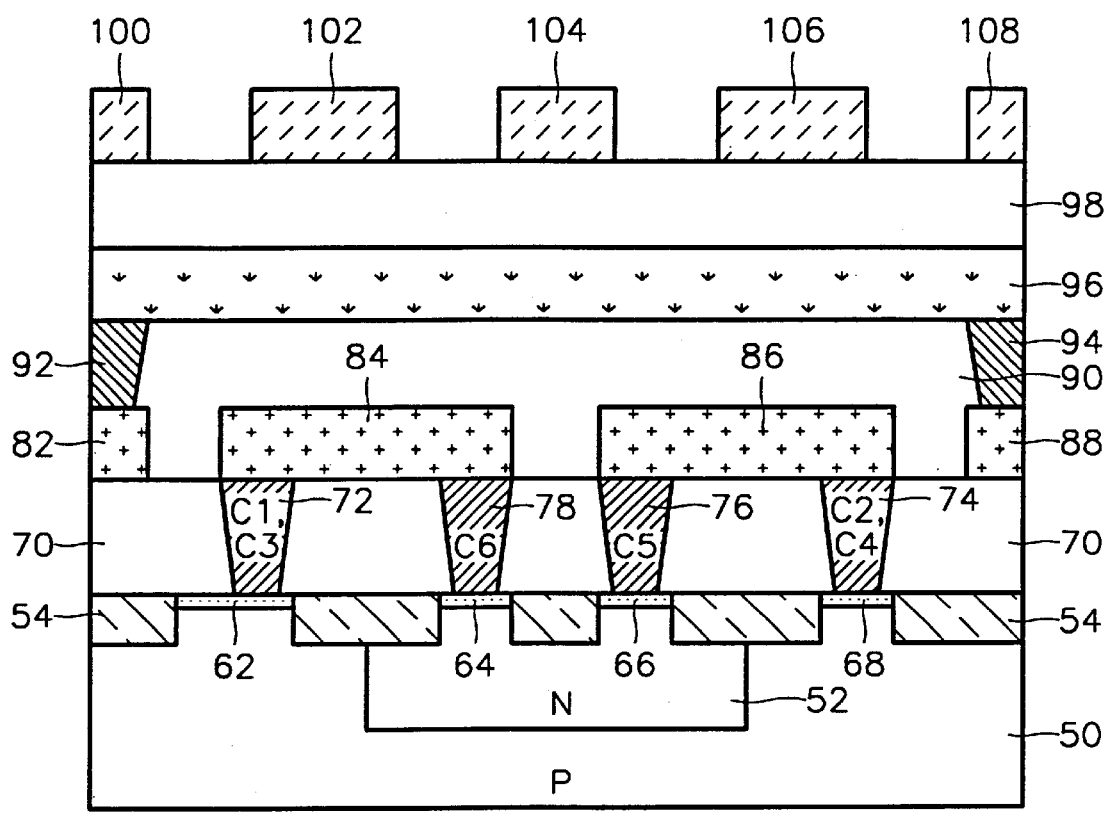

FIGS. 10 and 11 are sectional views taken along lines A–A' and B–B' in FIG. 9, respectively, of the embodiment of the SRAM device according to the present invention manufactured using the mask patterns of FIGS. 3 through 9.

A P-type well 50 (or p-type semiconductor device) for the NMOS transistors (i.e., the first and second access transistors and the first and second drive transistors) and an N-type well 52 for the PMOS transistors (i.e., the first and second load transistors) are formed. The first active region (corresponding to P10 of FIG. 3), the third active region (corresponding to P12 of FIG. 3), the fourth active region (corresponding to P14 of FIG. 3) and the second active region (corresponding to P16 of FIG. 3) are sequentially formed between trench field oxide layer 54 from the left to the right in FIGS. 10 and 11.

The source and drain of the first access transistor Q1 (not shown) and the source and drain of the first drive transistor Q3 are formed in the first active region. The drain of the first access transistor Q1 and the first drive transistor Q3 are designated with reference numeral 62 in FIG. 11. The source and drain of the first load transistor Q5 are formed in the third active region, wherein the source of the first load transistor Q5 is designated with reference numeral 64 in FIG. 11. The source and drain of the second load transistor Q6 are formed in the fourth active region, wherein the source of the second load transistor Q6 is designated with reference numeral 66 in FIG. 11. The source and drain of the second access transistor Q2 and the source and drain of the second drive transistor Q4 are formed in the second active region, wherein the drains of the second access transistor Q2 and the second drive transistor Q4 are designated with reference numeral 68 in FIG. 11.

The gates of the transistors are formed of a conductive material (first conductive layer), such as doped polysilicon. The gate 58 for the first drive transistor Q3 and the first load transistor Q5 extends over and crosses the first, third and fourth active regions, and the gate 60 for the second access transistor Q2 is formed perpendicular to the second active region. Although not shown, the gate of the second drive transistor Q4 and the second load transistor Q6 extends over and crosses the second, fourth and third active regions, and the gate of the first access transistor Q1 is formed perpendicular to the first active region. In FIG. 10, reference numeral 56 represents a gate oxide layer.

A larger width of drive transistors is advantageous for improving the static noise margin (SNM), and thus in the present embodiment, the first and second active regions are formed to have a larger width at the regions overlapped by the gates of the first and second drive transistors Q3 and Q4 than at the other regions, such that the gates of the first and second drive transistors have a larger width than the other transistors.

The first and second connection lines 84 and 86 are formed of a conductive material (second conductive layer), such as polysilicon, amorphous silicon, aluminum (Al), tungsten (W), titanium (Ti), cobalt (Co) or copper (Cu). The first connection line 84 connects the drain 62 of the first access transistor Q1 and the first driver transistor Q3, and the source 64 of the first load transistor Q5 and the gates (not shown) for the second drive transistor Q4 and the second load transistor Q6, via a contact plug 72 filling the contact hole C1/C3 and a contact plug 78 filling the contact hole C6. The second connection line 86 connects the drain 68 of the second access transistor Q2 and the second drive transistor Q4, and the source 66 of the second load transistor Q6 and the gate 58 (see FIG. 10) of the first drive transistor Q3 and the first load transistor Q5, via a contact plug 74 filling the contact hole C2/C4 and a contact plug 76 filling the contact hole C5.

Figure 2:
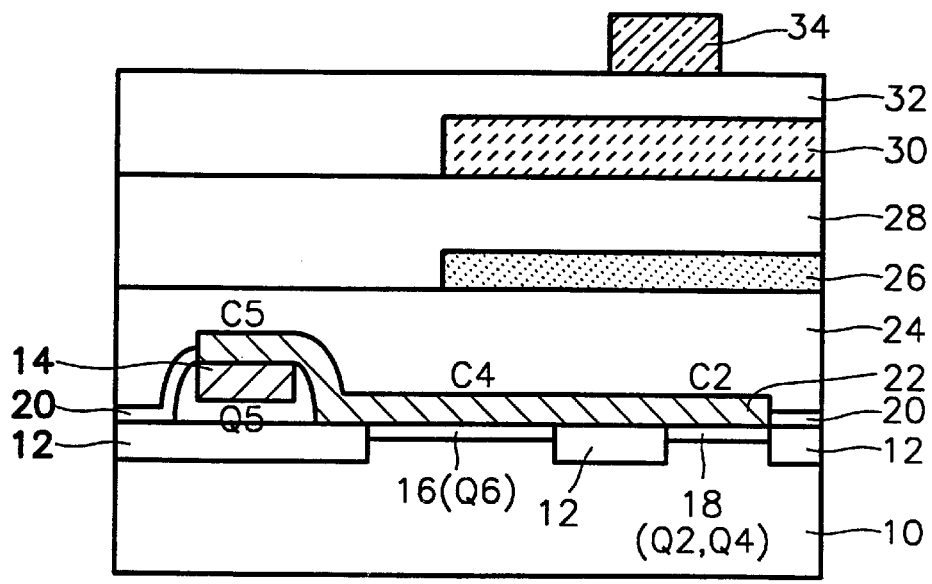
FIG. 2 is a sectional view showing part of a conventional full CMOS type SRAM cell.
Figure 3:
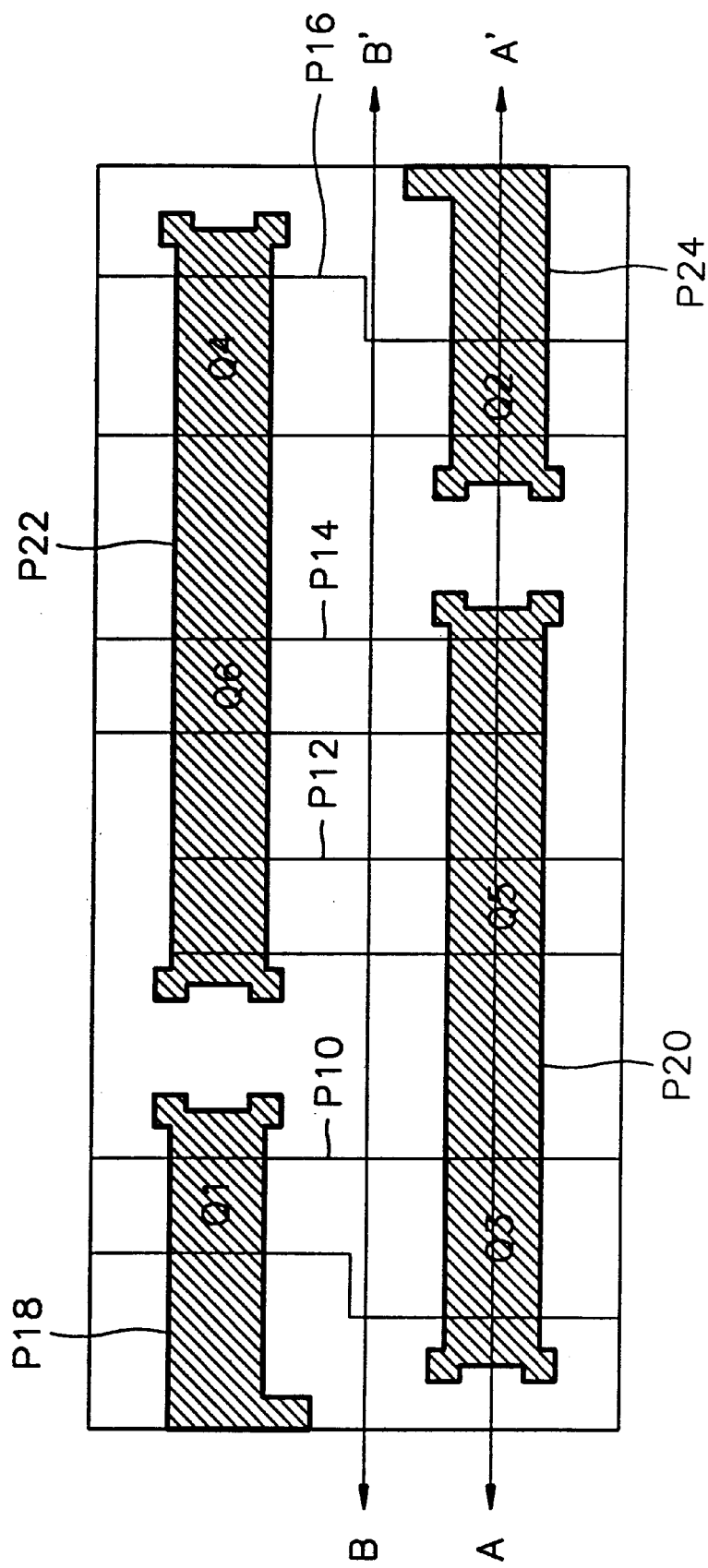
FIGS. 3 through 9 are layouts of the exemplary mask patterns used for manufacturing an SRAM device according to the present invention by a standard CMOS logic manufacturing process without need for additional masks or processes.

The first connection line 84, which connects the output of the first CMOS inverter and the input of the second CMOS inverter, and the second connection line 86, which connects the output of the second CMOS inverter and the input of the first CMOS inverter, correspond to the local interconnection line 22 in FIG. 2. The local interconnection line 22 shown in FIG. 2 are formed as a bilayer including a Ti layer and a TiN layer by an additional process using one more mask in CMOS standard logic manufacturing process. In contrast to the conventional local interconnection line 22 of FIG. 2, the first and second connection lines 84 and 86 according to the present invention are formed with common metal interconnection, and thus they can be attained by the CMOS standard logic manufacturing process without the need for additional masks or processes. The use of the metal interconnection in the connection line formation decreases resistance thereof with an advantage of an improved cell operating speed.

The word line 96, which is formed across the cell, like a strapping, on a second ILD film 90 covering the first and second connection lines 84 and 86, is connected via a second plug 92 filling the contact hole C9 and a second plug 94 filling the contact hole C10 to the gate of the first access transistor Q1 and the gate 60 of the second access transistor Q2. Similar to the first and second connection lines 84 and 86, the word line 96 is formed of a metal (third conductive layer) such as aluminum (Al) or Cu. In the prior art of FIG. 2, the formation of the word line 26 and via holes for connecting the word line 26 and the gates of the first and second access transistors requires two more masks for processes in addition to the CMOS standard logic manufacturing process. However, in the present embodiment, the word line 96 is formed of a general metal interconnection by the CMOS standard logic manufacturing process without the need for additional masks or processes.

The first power supply line 104 is for supplying the power supply voltage Vcc to the drains of the first load transistors Q5 and second load transistor Q6, and the second power supply lines 100 and 108 are for supplying ground voltage Vss to the sources of the first drive transistor Q3 and second drive transistor Q4. The first bit line 102 is connected to the source of the first access transistor Q1 and the second bit line 106 is connected to the source of the second access transistor Q2. The first power supply line 104, the second power supply lines 100 and 108, the first bit line 102 and the second bit line 106 are final metal lines made of, for example, Al or Cu. As can be seen from FIG. 9, the final metal lines are arranged parallel to the active regions but perpendicular to the gates of the transistors.

Since data stored in a SRAM cell is read by sensing a small voltage differential between a first bit line BL and a second bit line BLB, the neighboring bit line pair may interfere each other. However, the present embodiment arranges the first power supply line 104 or the second power supply line 100 or 108 between the first bit line 102 and the second bit line 106, thereby eliminating the problem of the interference between adjacent bit line pair.

Also, since the third active region and the fourth active region are arranged in a staggered manner (see P12 and P14 in FIG. 3), the aspect ratio of cell can be decreased. If the aspect ratio of a cell decreases, the length of bit line that directly affect the operating speed of a device, can be decreased to have a small parasitic capacitance. Accordingly, the operating speed of the device can be raised.

In addition, since all the conductive layers (three metal layers) except for the gates of transistors are formed of a metal, the embodiment of the SRAM device according to the present invention can be manufactured by the general standard CMOS manufacturing process without need for additional masks, with improved operating speed.

FIGS. 12 through 18, and FIGS. 19 through 25 sequentially illustrate an embodiment of an SRAM device manufacturing process according to the present invention. FIGS. 12 through 18 show the cross sections taken along line A–A' of FIGS. 3 through 9, and FIGS. 19 through 25 show the cross-sections taken along line B–B' of FIGS. 3 through 9.

Figure 12:
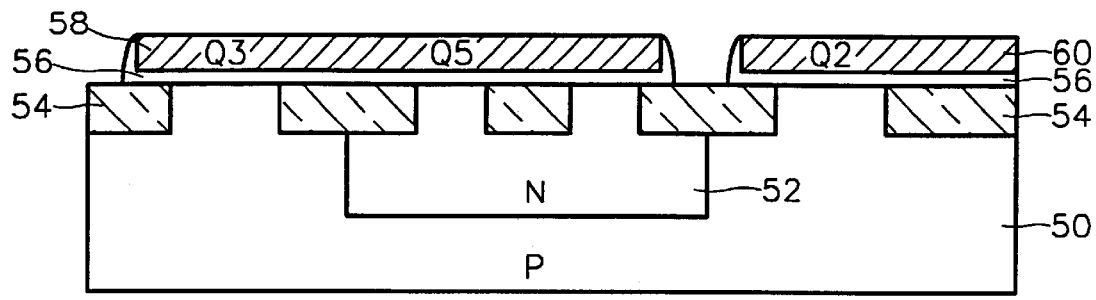
FIGS. 12 through 18 are sectional views corresponding to the cross sections taken along line A–A' of FIGS. 3 through 9, respectively, sequentially illustrating an embodiment of SRAM device manufacturing process according to the present invention.
Figure 19:
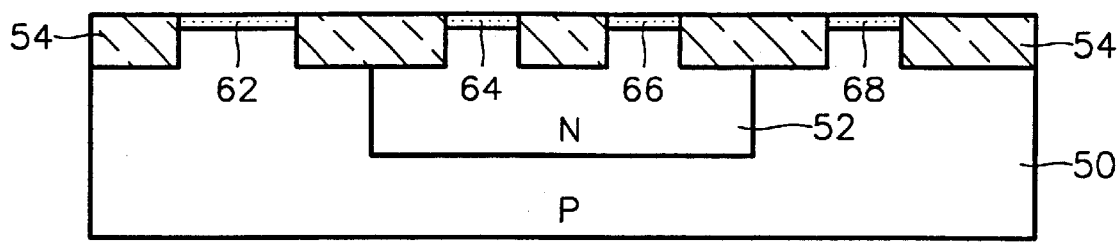
FIGS. 19 through 25 are sectional views corresponding to the cross sections taken along line B–B' of FIGS. 3 through 9, respectively, sequentially illustrating the embodiment of SRAM device manufacturing process according to the present invention.

Referring to FIGS. 12 and 19, the P-type well 50 (or semiconductor substrate) for the NMOS transistors (i.e., first and second access transistors Q1 and Q2 and the first and second drive transistors Q3 and Q4) is formed by ion implantation of, for example, boron (B) ions at a dose of $2-3\times10E13/cm^2$. The N-type well 52 for the PMOS transistors (i.e., first and second load transistors Q5 and Q6), is formed by ion implantation of, for example, arsenic (As) ions at a dose of $3-4\times10E13/cm^2$. In turn, the trench type field oxide layers 54 are formed using the mask patterns P10, P12, P14 and P16 (see FIG. 3) to define the first through fourth active regions in the semiconductor substrate. As shown in FIGS. 12 and 19, the first through fourth active regions, which are sequentially arranged from the left to the right of the figures, are formed between the trench type field oxide layers 54. The shapes and arrangements of the first through fourth active regions are the same as shown in the mask patterns P10, P12, P14 and P16 in FIG. 3, respectively. For ease of understanding the shape and arrangement of the active regions, reference is made to FIGS. 10 and 11 and the description thereof.

The gate oxide layer 56 is formed over the entire surface of the semiconductor substrate 50 to a thickness of about 3–6 nm. Then, a material layer for gates, i.e., a first conductive layer (to be the gates of transistors), is formed by depositing a conductive material, for example, doped polysilicon, on the semiconductor substrate 50, and then subjected to a photolithography process using the mask patterns P18, P20, P22 and P24 (see FIG. 3), to define the gate (not shown, corresponding to the mask pattern P18 of FIG. 3) of the first access transistor Q1, the gate 58 (corresponding to the mask pattern P20 of FIG. 3) of the first drive transistor Q3 and the first load transistor Q5, the gate (not shown, corresponding to the mask pattern P22 of FIG. 3) of the second drive transistor Q4 and the second load transistor Q6, and the gate 60 (corresponding to the mask pattern P24 of FIG. 3) of the second access transistor Q2. For ease of understanding about the shape and arrangement of the gates, reference is made FIGS. 3, 10 and 11 and the description thereof.

Subsequently, N-type ions, for example, As ions, are implanted into the P-type well 50 to a dose of about $1 \times 10E13/cm^2$, and P-type ions, for example, B ions, are implanted into the N-type well 52 to a dose of about $2 \times 10E14/cm^2$, to thereby lightly doped sources and drains of the transistors. Then, an oxide layer is deposited and subjected to anisotropic etching to form sidewall spacers of the gates of the transistors. Then, the As ions and B ions are implanted to a dose of about $1–7 \times 10E15/cm^2$ into the P-well 50 and the N-well 52, respectively, to define heavily doped sources and drains of transistors. In FIG. 19, the sources and drains of the transistors have a lightly doped drain (LDD) structure obtained by two implantation processes. Reference numeral 62 represents the drain of the first access transistor Q1 and the first drive transistor Q3, reference numeral 64 represents the source of the first load transistor Q5, reference numeral 66 represents the source of the second load transistor Q6, and reference numeral 68 represents the drain of the second access transistor Q2 and the second drive transistor Q4.

Figure 13:
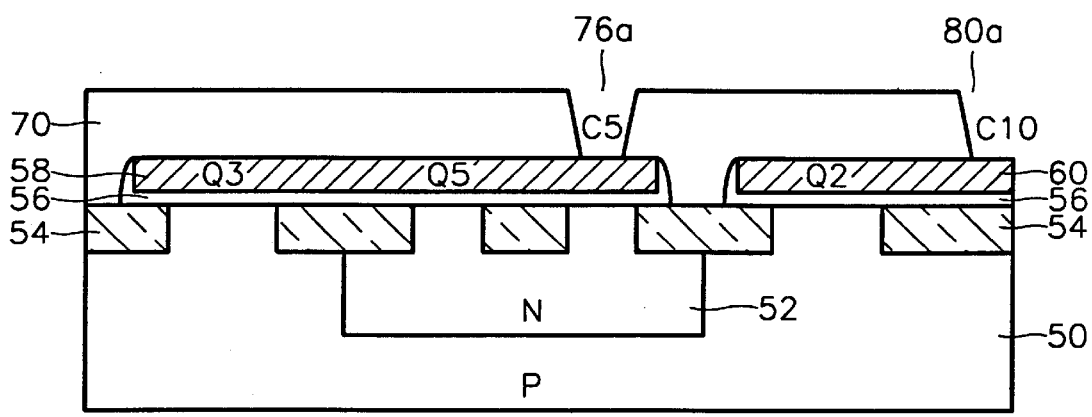
Figure 20:
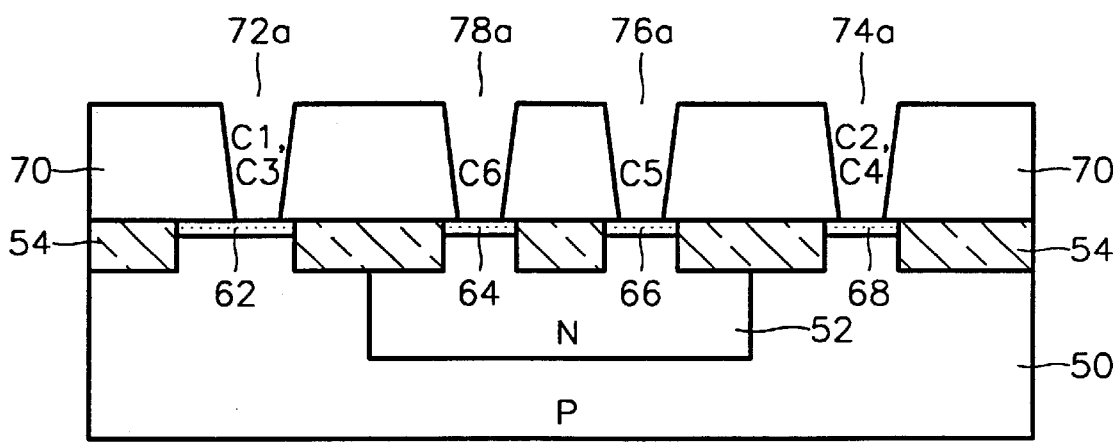

Referring to FIGS. 13 and 20, an oxide layer (not shown) is deposited over the semiconductor substrate 30 having the gates of the transistors, for example, to a thickness of 500–1000 nm and is planarized by chemical mechanical polishing (CMP), resulting in the first ILD film 70. Then, the first ILD film 70 is subjected to a photolithography process using the mask patterns P26 through P48 of FIG. 4, to form (1) the contact hole C7 (not shown, corresponding to the mask pattern P26 of FIG. 4) exposing the source (not shown) of the first access transistor Q1; (2) the contact hole C9 (not shown, corresponding to the mask pattern P28 of FIG. 4) exposing the gate (not shown) of the first access transistor Q1; (3) the contact hole C1/C3 indicated by reference numeral 72a (corresponding to the mask pattern P30 of FIG. 4) exposing the drain 62 of the first access transistor Q1 and the first drive transistor Q3; (4) the contact hole C11 (not shown, corresponding to the mask pattern P32 of FIG. 4) exposing the source (not shown) of the first drive transistor Q3; (5) the contact hole C12 for the first inverter (not shown, corresponding to the mask pattern P34 of FIG. 4) exposing the drain (not shown) of the first load transistor Q5; (6) the contact hole C6 indicated by reference numeral 78a (corresponding to the mask pattern P36 of FIG. 4) exposing both the source 64 of the first load transistor Q5 and the gate (not shown) of the second drive transistor Q4 and the second load transistor Q6; (7) the contact hole C8 (not shown, corresponding to the mask pattern P38 of FIG. 4) exposing the source (not shown) of the second access transistor Q2; (8) the contact hole C10 indicated by reference numeral 80a (corresponding to the mask pattern P40 of FIG. 4) exposing the gate 60 of the second access transistor Q2; (9) the contact hole C2/C4 indicated by reference numeral 74a (corresponding to the mask pattern P42 of FIG. 4) exposing the drain 68 of the second access transistor Q2 and the second drive transistor Q4; (10) the contact hole C11 for the second inverter (not shown, corresponding to the mask pattern P44 of FIG. 4) exposing the drain (not shown) of the second drive transistor Q4; (11) the contact hole C12 for the second inverter (not shown, corresponding to the mask pattern P46 of FIG. 4) exposing the drain (not shown) of the second load transistor Q6; and (12) the contact hole C5 indicated by reference numeral 76a (corresponding to the mask pattern P48 of FIG. 4) exposing both the gate 58 of the first drive transistor Q3 and the first load transistor Q5 and the source 66 of the second load transistor Q6.

Figure 14:
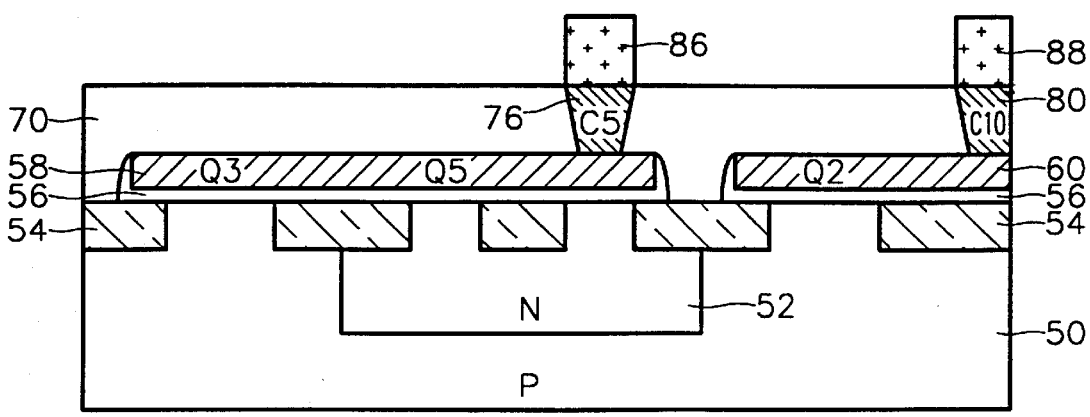
Figure 21:
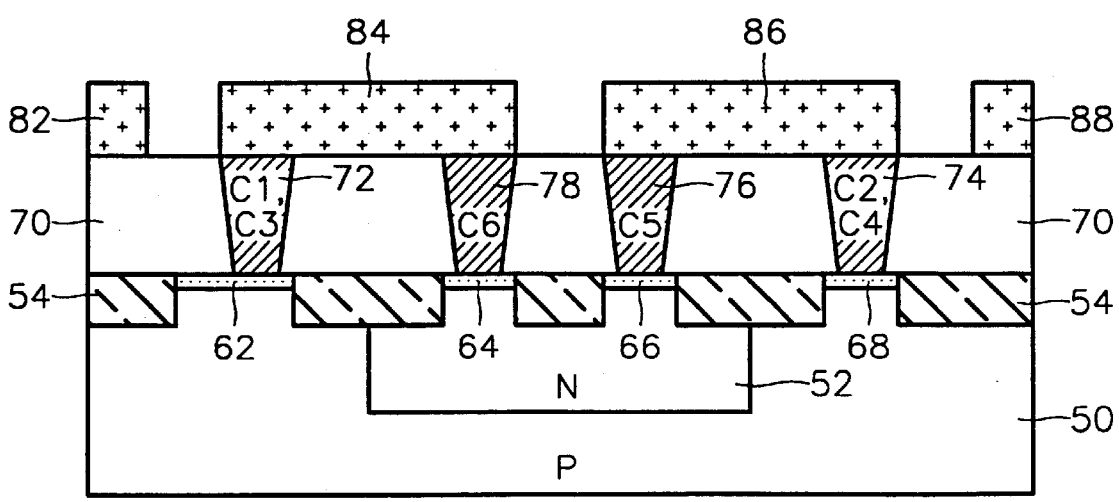

Referring to FIGS. 14 and 21, a material such as tungsten W is deposited over the semiconductor substrate 50 having the contact holes C1/C3 (72a), C6 (78a), C5 (76a) and C2/C4 (74a), for example, to a thickness of about 300–400 nm, and then subjected to etching by, for example, CMP, resulting in first plugs filling the contact holes. In FIGS. 14 and 21, reference numeral 72 represents the first plug C1/C3 filling the contact hole C1/C3 (indicated by reference numeral 72a in FIG. 20); reference numeral 74 represent the first flag C2/C4 filling the contact hole C2/C4 (indicated by reference numeral 74a in FIG. 20); reference numeral 76 represents the first plug C5 filling the contact hole C5 (indicated by reference numeral 76a in FIGS. 13 and 20); reference numeral 78 represents the first plug C6 filling the contact hole C6 (indicated by reference numeral 78a in FIG. 20); and reference numeral 80 represents the first plug C10 filling the contact hole C10 (indicated by reference numeral 80a in FIG. 13). Although not shown, the contact holes C7 and C9, the contact holes C11 and C12 for the first inverter, the contact holes C11 and C12 for the second inverter, and the contact hole C6 are also filled with first plugs.

Subsequently, a second conductive layer is formed by depositing a conductive material, for example, polysilicon, amorphous silicon, Al, W, Ti, Co or Cu, on the semiconductor substrate 50 having the first plugs, and then subjected to a photolithography process using the mask patterns P50 through P66 of FIG. 5 to form (1) a first pad layer C7 (designated with P50 in FIG. 5) connected via the first plug C7 to the source of the first access transistor Q1; (2) a first pad layer 82 (corresponding to the first pad layer C9 designated with P52 in FIG. 5) connected via the first plug C9 to the gate of the first access transistor; (3) a first pad layer C11 for the first inverter (not shown, designated with P54 in FIG. 5) connected via the first plug C11 to the source of the first drive transistor Q3; (4) a first pad layer C12 for the first inverter (not shown, designated with P56 in FIG. 6) connected via the first plug C12 to the drain of the first load transistor Q5; (5) a first connection line 84 (designated with P58 in FIG. 5) connecting the drain 62 of the first access transistor Q1 and the first drive transistor Q3 via the first plug C1/C3 and the first plug C6 to the source 64 of the first load transistor Q5 and the gate (not shown) of the second drive transistor Q4 and the second load transistor Q6; (6) a first pad layer C8 (not shown, designated with P60 in FIG. 5) connected via the first plug C8 to the source of the second access transistor Q2; (7) a first pad layer 88 (corresponding to the first pad layer C10, designated with P62 in FIG. 5) connected via the first plug C10 (designated with reference numeral 80 in FIG. 14) filling the contact hole C10 to the gate 60 of the second access transistor Q2; (8) a first pad layer for the second inverter (not shown, corresponding to the first pad layer C11 designated with P64 in FIG. 5) connected via the first plug C11 for the second inverter to the source of the second drive transistor Q4; (9) a first pad layer for the second inverter (not shown, corresponding to the first pad layer C12 designated with P66 in FIG. 5) connected via the first plug for the second inverter filling the contact hole C12 to the drain of the second load transistor Q6; and (10) a second connection line 86 (designated with P68 in FIG. 5) connecting the drain 68 of the second access transistor Q2 and the second drive transistor Q4 via the first plug 74 filling the contact hole C2/C4 and the first plug 76 filling the contact hole C5 to the source 66 of the second load transistor Q6 and the gate 58 of the first drive transistor Q3 and the first load transistor Q5.

The formation of the first pad layers and the first and second connection lines belongs to a general photolithography process using metal, and thus it can be simultaneously achieved in CMOS standard manufacturing process. The detailed arrangement of the first and second connection lines can be noticed from the description with reference to FIGS. 5, 10 and 11.

Figure 15:
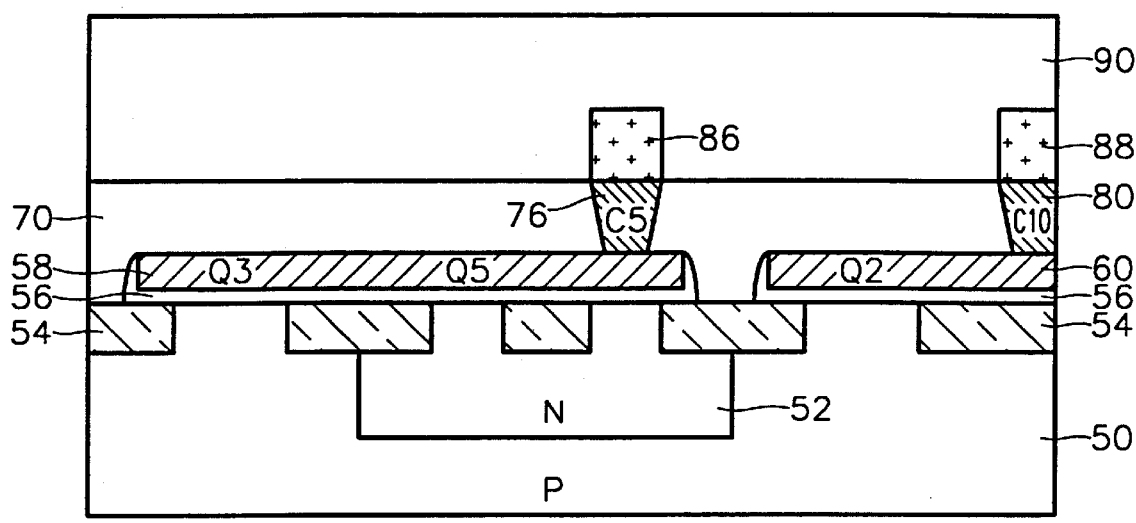
Figure 22:
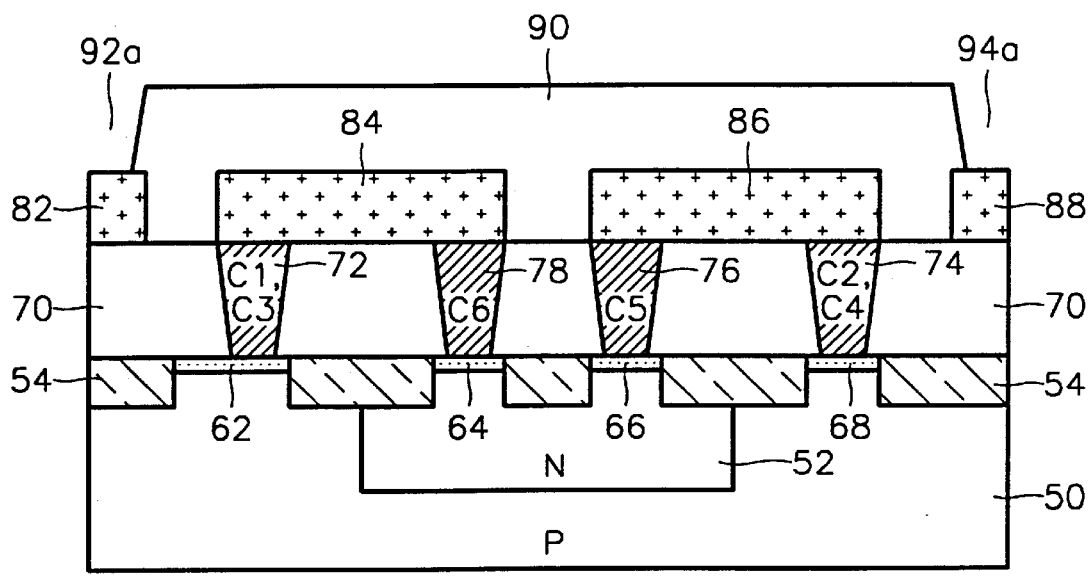

Referring to FIGS. 15 and 22, a second ILD film 90 is formed over the semiconductor substrate 50 having the first pad layers and the first and second connection lines, and photolithography is applied to the structure using the mask patterns P70 through P84 in FIG. 6, to form (1) a first via hole C7 (not shown, designated with P70 in FIG. 6) exposing the first pad layer C7; (2) a first via hole 92a (corresponding to the first via hole C9 designated with P72 in FIG. 6) exposing the first pad layer C9; (3) a first via hole C11 for the first inverter (not shown, designated with P74 in FIG. 6) exposing the fist pad layer C11 for the first inverter; (4) a first via hole C12 for the first inverter (designated with P76 in FIG. 6) exposing the first pad layer C12 for the second inverter; (5) a first via hole C8 (not shown, designated with P78 in FIG. 6) exposing the first pad layer C8; (6) a first via hole 94a (corresponding to the first via hole C10 designated with P80 in FIG. 6) exposing the first pad layer C10; (7) a first via hole C11 for the second inverter (not shown, designated with P82 in FIG. 6) exposing the first pad layer C11 for the second inverter; and (8) a first via hole C12 for the second inverter (not shown, designated with P84 in FIG. 6) exposing the first pad layer C12 for the second inverter.

Figure 16:
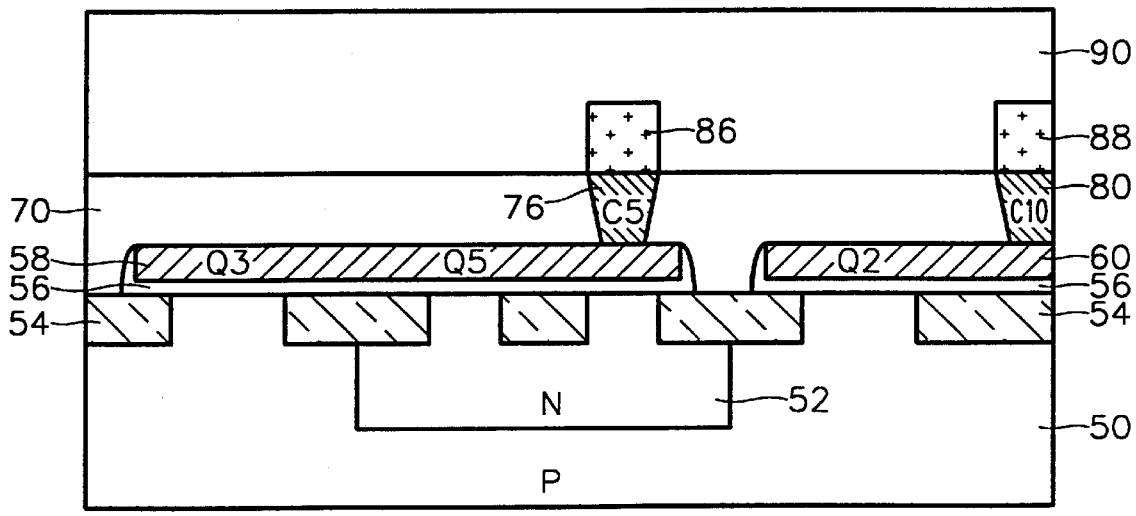
Figure 23:
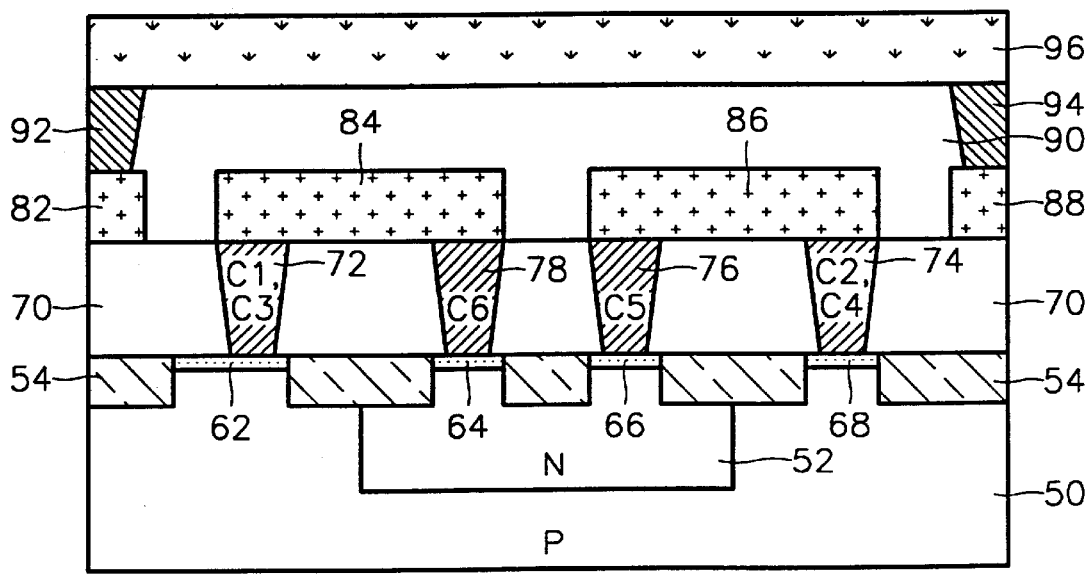

Referring to FIGS. 16 and 23, the first via holes are filled with metal, for example, tungsten (W), and planarized by CMP, forming second plugs. For example, in FIG. 23, reference numeral 92 represents the second plug C9 filling the first via hole 92a in FIG. 22 and reference numeral 94 represents the second plug C10 filling the first via hole 94a in FIG. 22. Then, metal such as aluminum (Al) or copper (Cu) is deposited on the structure to form a third conductive layer, and subjected to photolithography using the mask patterns P86 through P98 in FIG. 7 to form (1) a second pad layer C7 (not shown, designated with P86 in FIG. 7) connected via the second plug C7 to the source of the first access transistor Q1; (2) a second pad layer C12 for the second inverter (not shown, designated with P88 in FIG. 7) connected via the second plug C12 for the second inverter to the drain of the second load transistor Q6; (3) a second pad layer C11 for the second inverter (not shown, designated with P90 in FIG. 7) connected via the second plug C11 for the second inverter to the source of the second drive transistor Q4; (4) a second pad layer C8 (not shown, designated with P92 in FIG. 7) connected via the second plug C8 to the source of the second access transistor Q2; (5) a second pad layer C12 for the first inverter (not shown, designated with P94 in FIG. 7) connected via the second plug C12 for the first inverter to the drain of the first load transistor Q5; (6) a second pad layer C11 for the first inverter (not shown, designated with P54 in FIG. 7) connected via the second plug C11 for the first inverter to the source of the first drive transistor Q3; and (7) a word line 96 connecting the gate of the first access transistor Q1 to the gate 60 of the second access transistor Q2 via the second plug 92 filling the first via hole C9 and the second plug 94 filling the first via hole C10.

The formation of the second pad layers and the word line 96 belongs to a general lithography process using metal, and thus it can be simultaneously achieved in CMOS standard logic manufacturing process.

Figure 17:
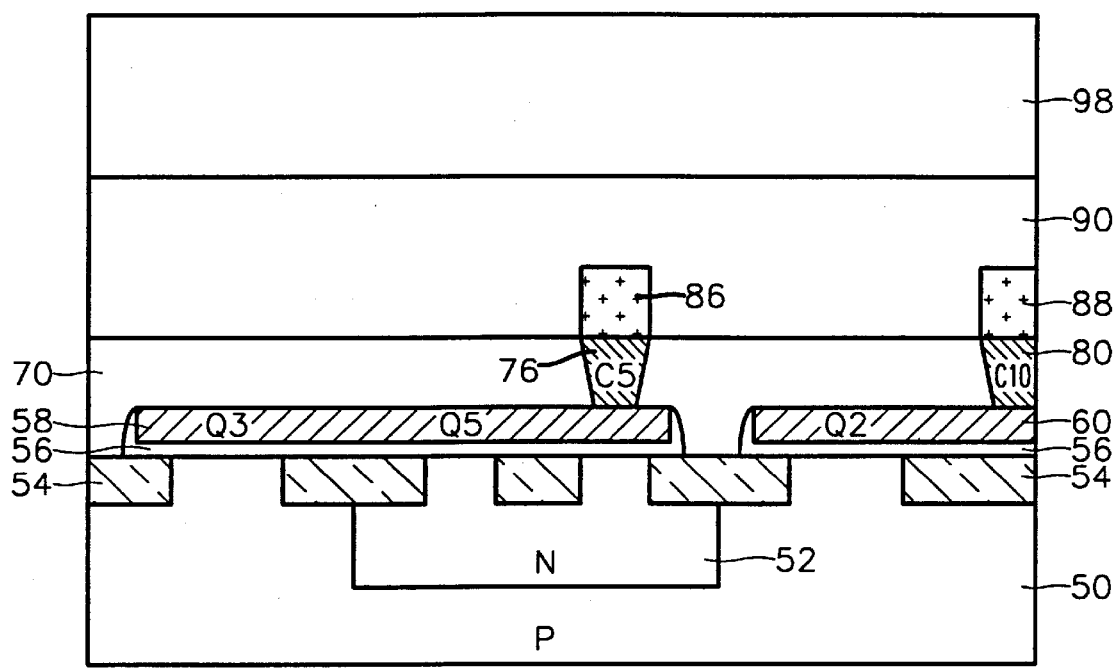
Figure 24:
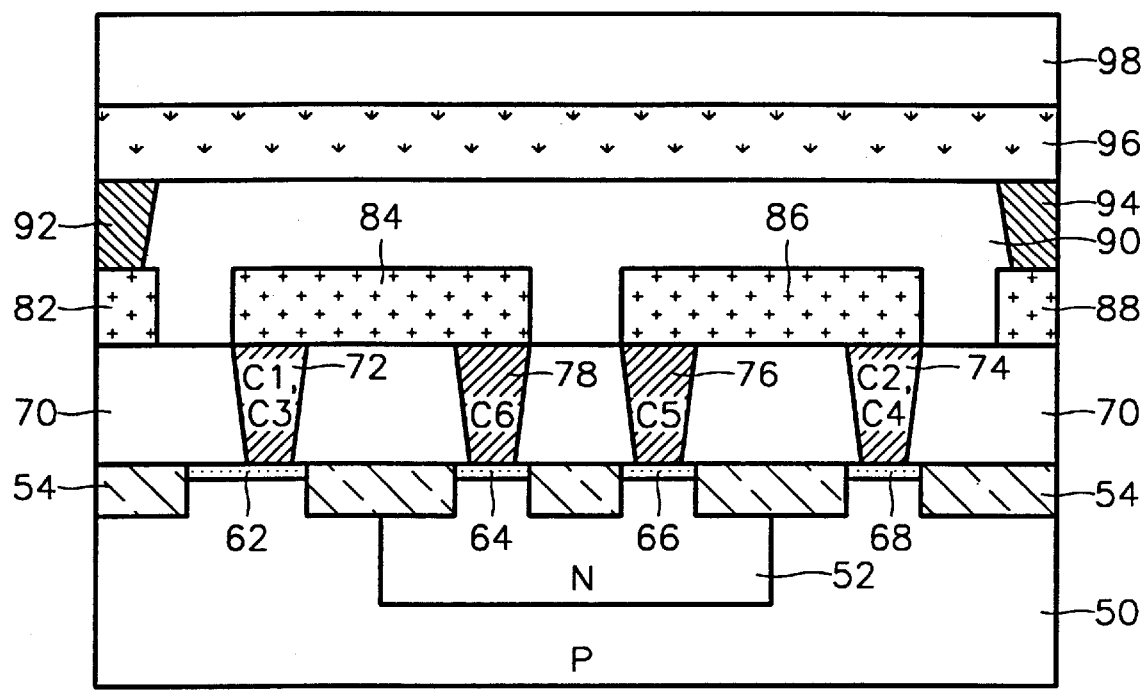

Referring to FIGS. 17 and 24, a third IDL film 98 is formed on the entire surface of the substrate having the second pad layers and the word line 96, and subjected to photolithography using the mask patterns P100 through P108 in FIG. 8 to form (1) a second via hole C7 (not shown, designated with P100 in FIG. 8) exposing the second pad layer C7; (2) a second via hole C12 for the second inverter (not shown, designated with P102 in FIG. 8) exposing the second pad layer C12 for the second inverter; (3) a second via hole C12 for the first inverter (not shown, designated with P104 in FIG. 8) exposing the second pad layer C12 for the first inverter; (4) a second via hole C8 (not shown, designated with P106 in FIG. 8) exposing the second pad layer C8; (5) a second via hole C11 for the first inverter (not shown, designated with P108 in FIG. 8) exposing the second pad layer C11 for the first inverter; and (6) a second via hole C11 for the second inverter (not shown, designated with 110 in FIG. 9) exposing the second pad layer C11 for the second inverter.

Figure 18:
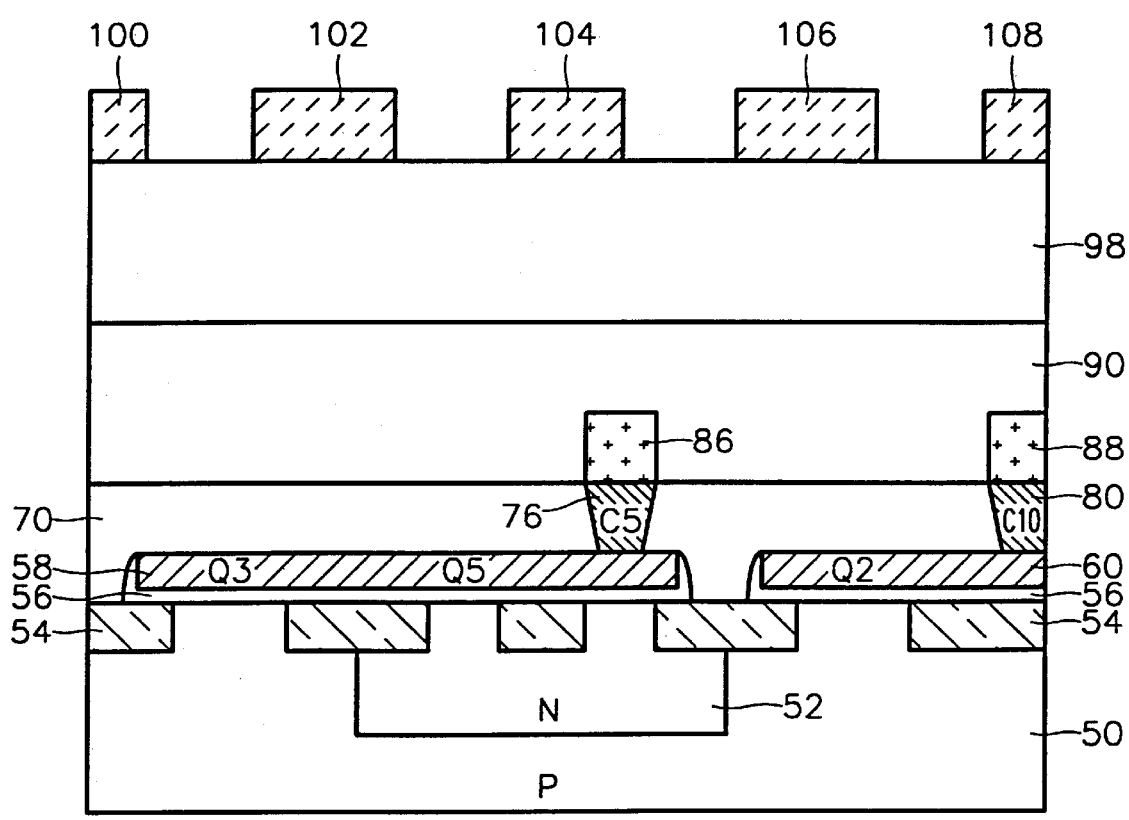
Figure 25:
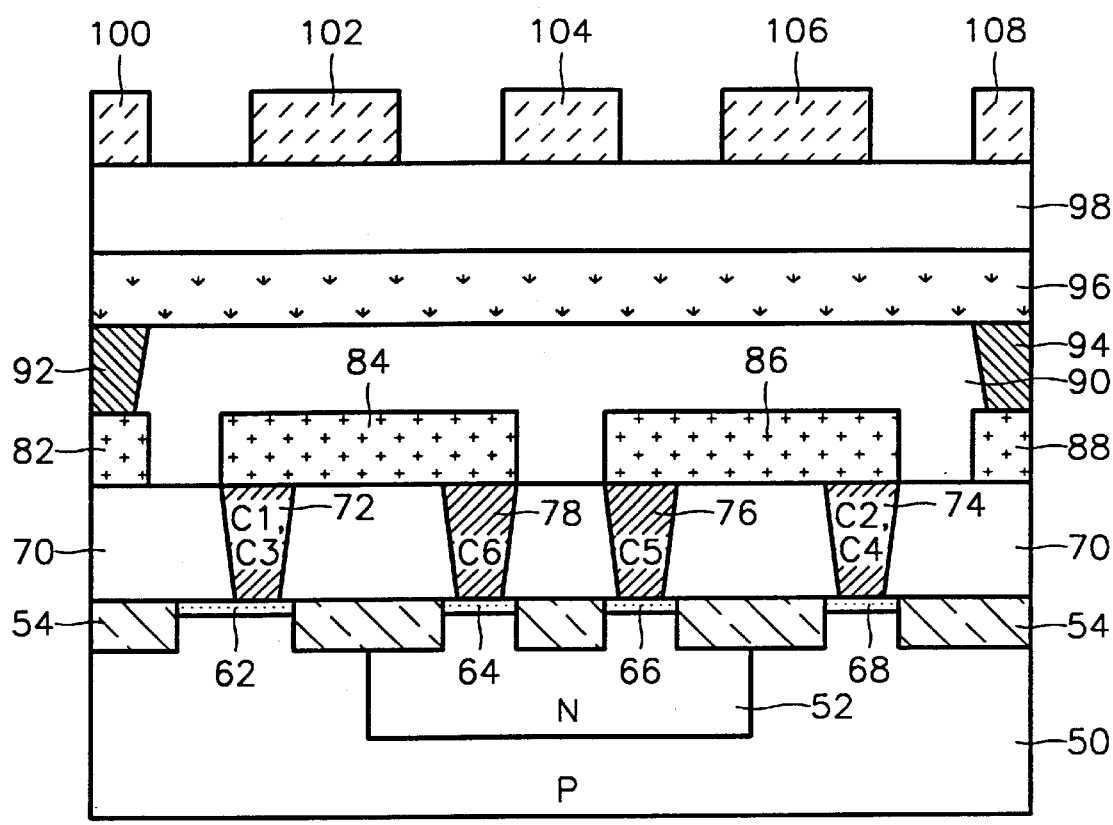

Referring to FIGS. 18 and 25, the second via holes are filled with a conductive material such as tungsten (W), and planarized by CMP, to form third plugs. For example, a third plug C7 fills the second via hole C7, and a third plug C11 (not shown) for the first inverter fills the second via hole C11 for the first inverter. Then, metal such as aluminum (Al) or copper (Cu) is deposited on the structure having the third plugs to form a fourth conductive layer, and subjected to photolithography using the mask patterns P112 through P120 in FIG. 9 to form (1) a second power supply line 100 (for supplying ground voltage Vss, designated with P112 in FIG. 9) connected via the third plug C11 for the first inverter to the source of the first drive transistor Q3; (2) a first bit line 102 (designated with P114 in FIG. 9) connected via the third plug C7 (not shown) to the source of the first access transistor Q1; (3) a first power supply line 104 (for supplying power supply voltage Vcc, designated with P116 in FIG. 9) connected to the drain of the first load transistor Q5 via the third plug C12 for the first inverter, and to the drain of the second load transistor Q6 via the third plug C12 for the second inverter; (4) a second bit line 106 (designated with P118 in FIG. 9) connected via the third plug C8 to the source of the second access transistor Q2; and (5) a first power supply line 108 (for supplying ground voltage Vss, designated with P120 in FIG. 9) connected via the third plug C1 for the second inverter to the source of the second drive transistor Q4.

FIGS. 26 through 29 show the layout of another embodiment of mask patterns according to the present invention.

Figure 26:
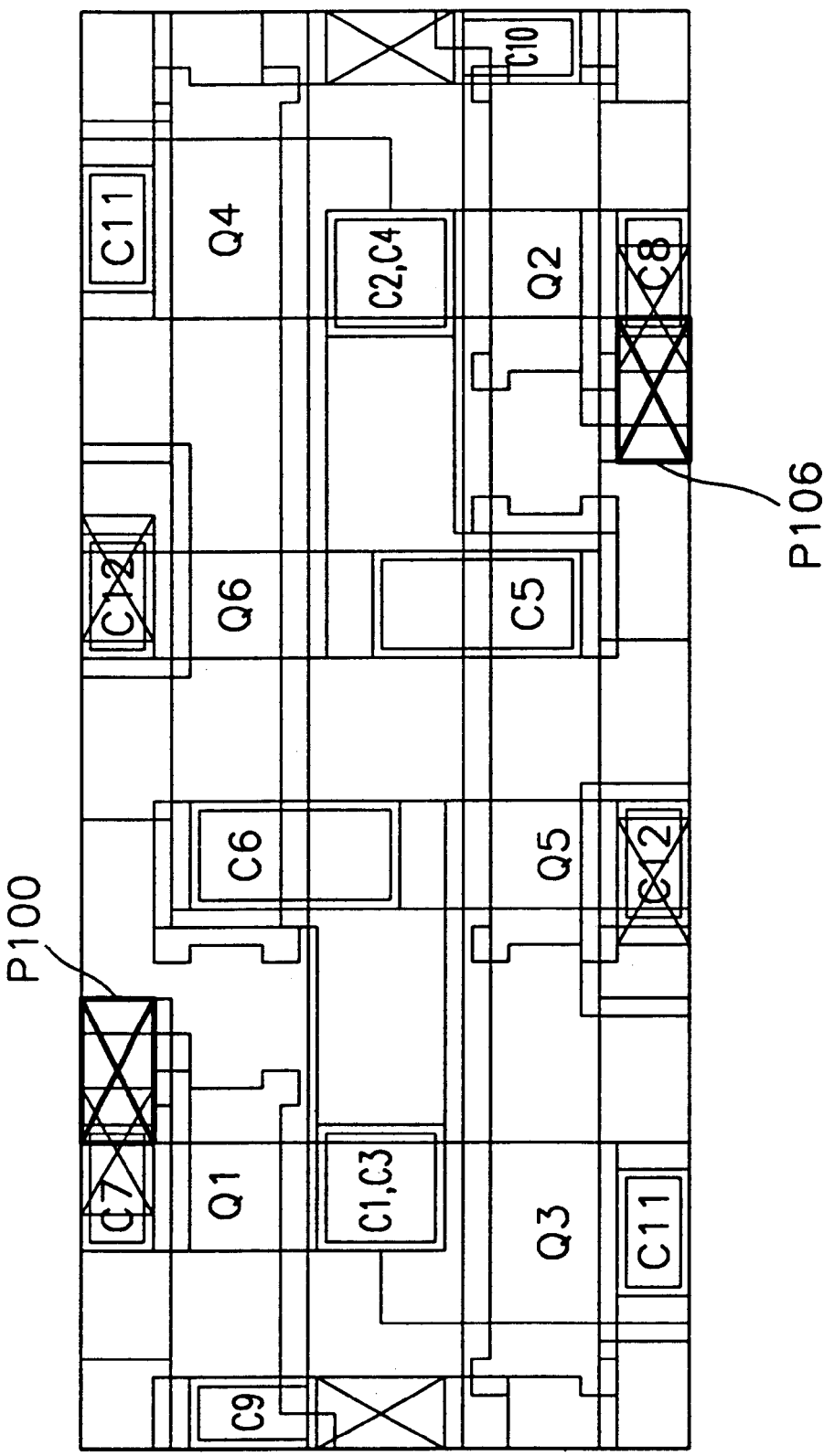
FIGS. 26 through 29 are layouts of alternative exemplary mask patterns according to the present invention.

Referring to FIG. 26, which shows the layout of mask patterns for forming second via holes which connect bit lines to transistors, reference symbol P100 represents the mask pattern for forming the second via hole C7 formed on the second pad layer C7, and reference symbol P106 represents the mask pattern for forming the second via hole C8 on the second pad layer C8.

Figure 27:
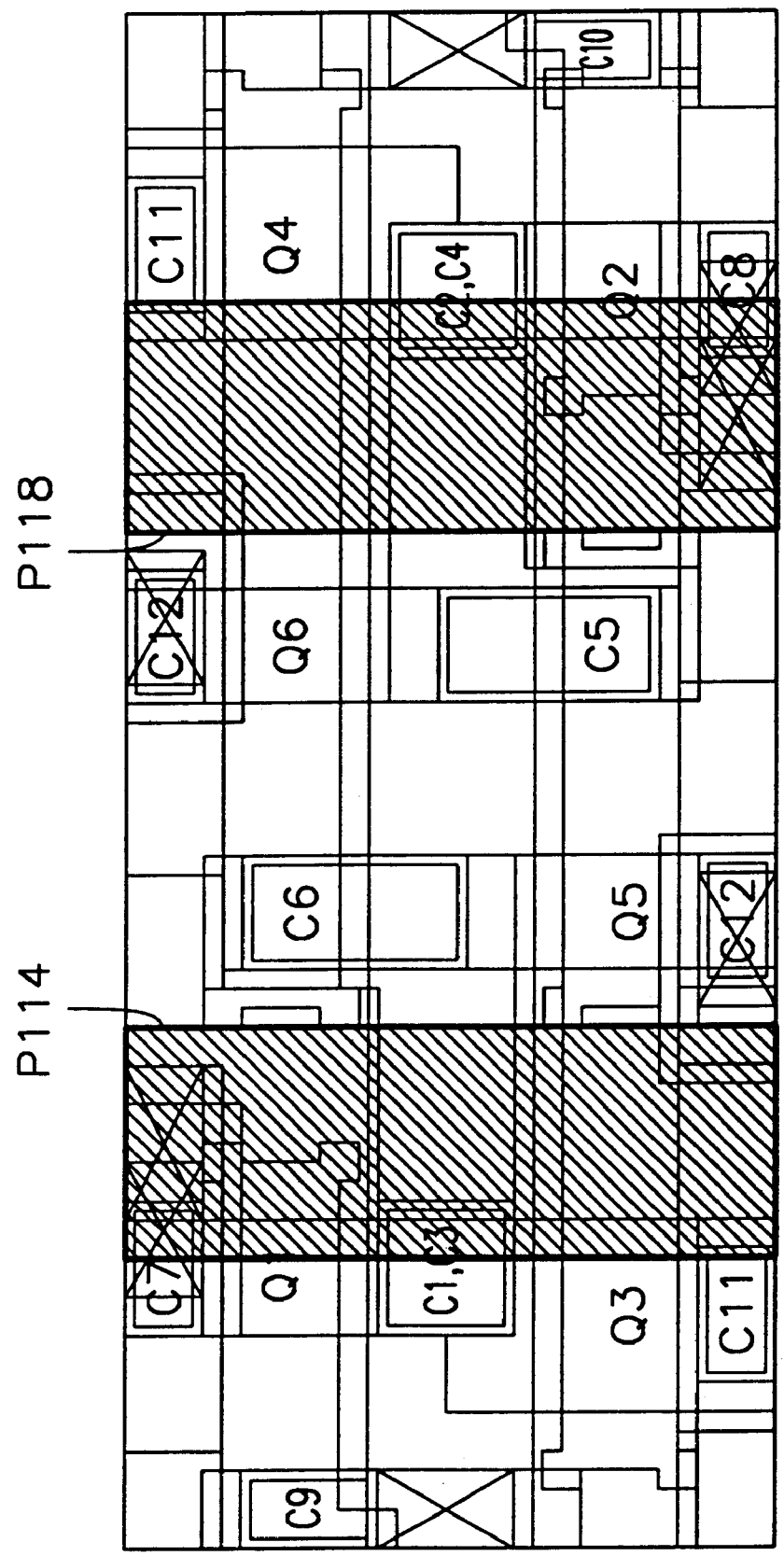

Referring to FIG. 27, which shows the layout of mask patterns for forming bit lines, reference symbol P114 represents the mask pattern for forming the first bit line connected via the second via hole C7 to the source of the first access transistor Q1, and reference symbol P118 represents the mask pattern for forming the second bit line connected via the second via hole C8 to the source of the second access transistor Q2.

Figure 28:
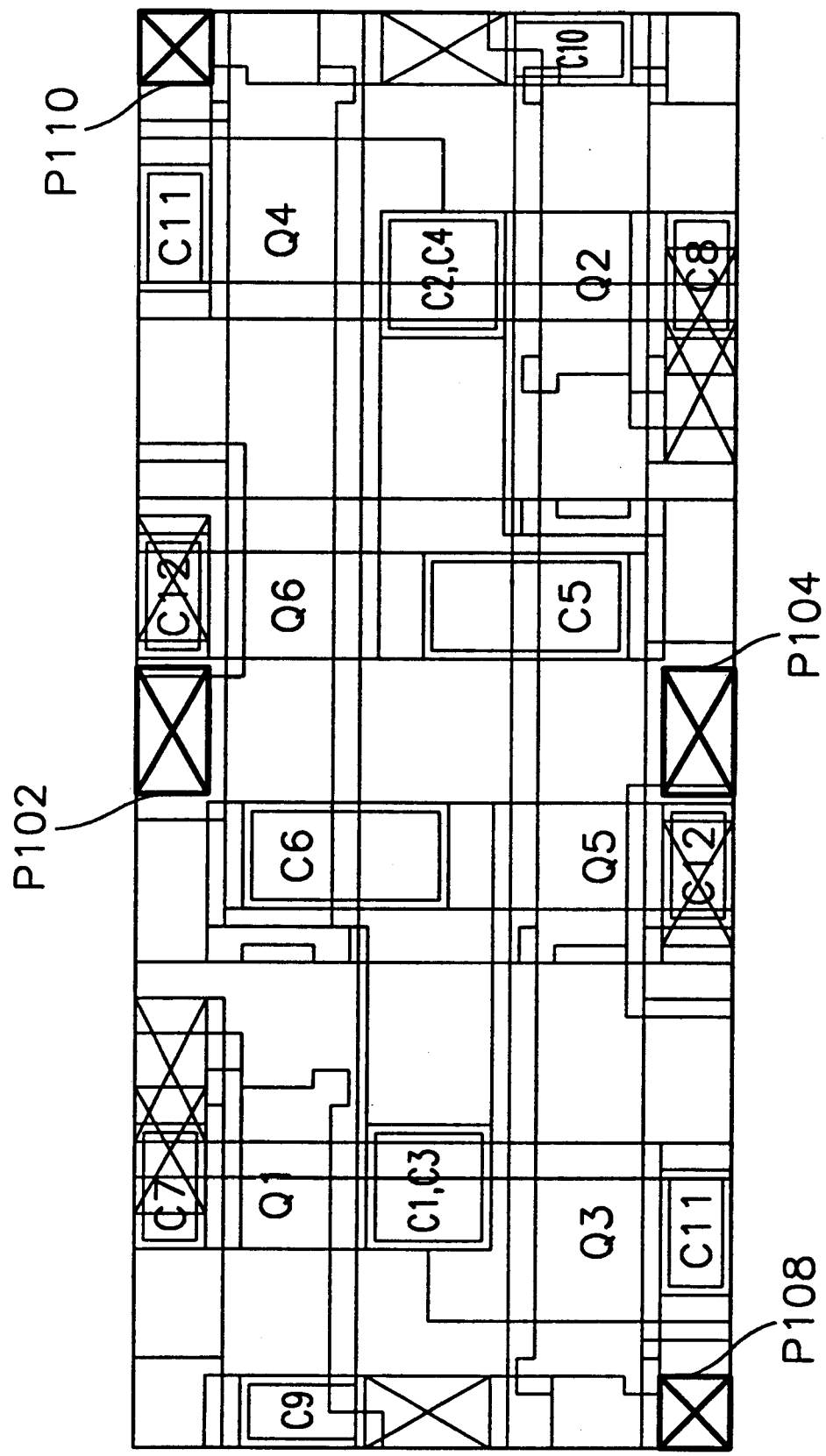

Referring to FIG. 28, which shows the layout of mask patterns for forming third via holes for connecting the power supply lines to transistors, reference symbol P102 represents the mask pattern for forming the third via hole C12 for the second inverter formed on the second pad layer C12, reference symbol P104 represents the mask pattern for forming the third via hole C12 for the first inverter formed on the second pad layer C12, reference symbol P108 represents the mask pattern for forming the third via hole C11 for the first inverter formed on the second pad layer C11, and reference symbol P110 represents the mask pattern for forming the third via hole C11 for the second inverter formed on the second pad layer C11.

Figure 29:
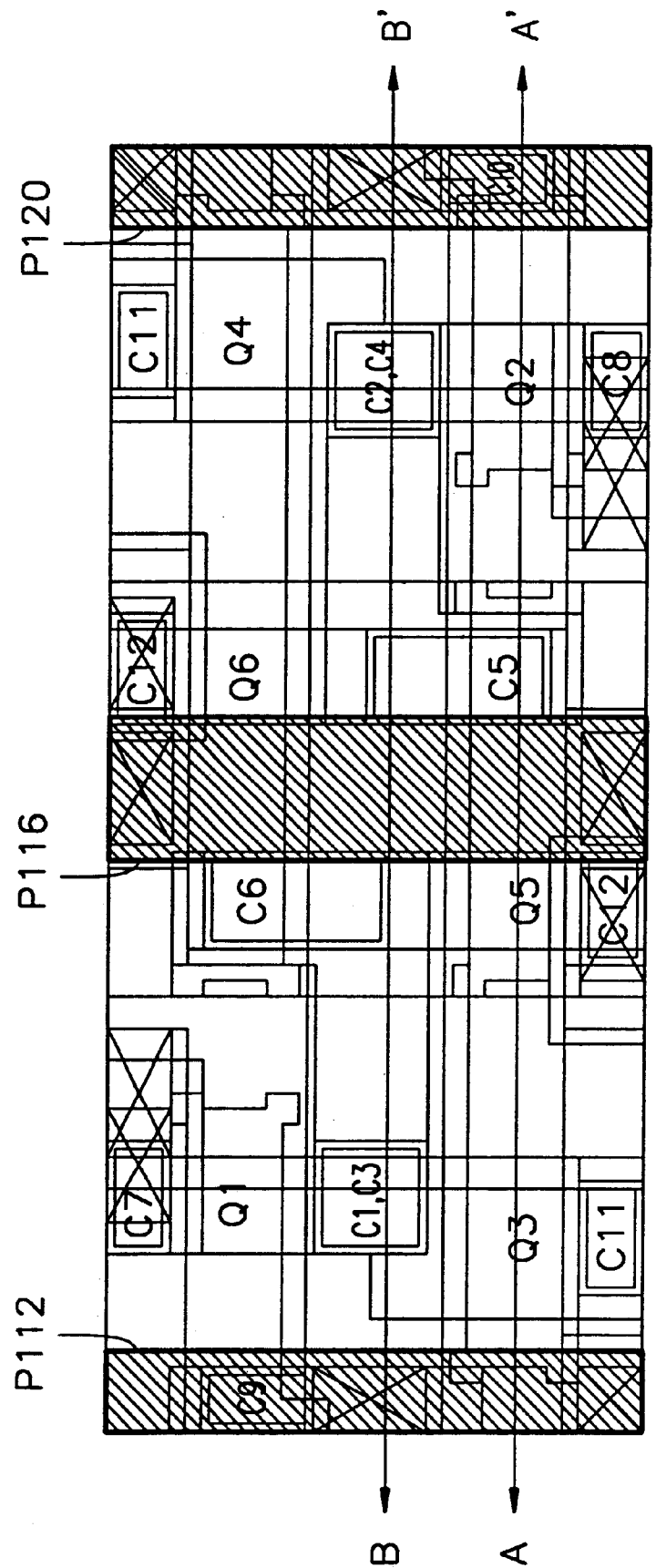

Referring to FIG. 29, which shows the layout of mask patterns for forming power supply lines, reference symbol P112 represents the mask pattern for forming the second power supply line (for supplying ground voltage Vss) connected via the third via hole C11 for the first inverter to the source of the first drive transistor Q3, reference symbol P116 represents the mask pattern for forming the first power supply line (for supplying power supply voltage Vcc) connected to the drain of the first load transistor Q5 via the third via hole C12 for the first inverter, and to the drain of the second load transistor Q6 via the third via hole C12 for the second inverter, and reference symbol P120 represents the mask pattern for forming a second power supply line (for supplying ground voltage Vss) connected via the third via hole C11 for the second inverter to the source of the second drive transistor Q4.

Figure 30:
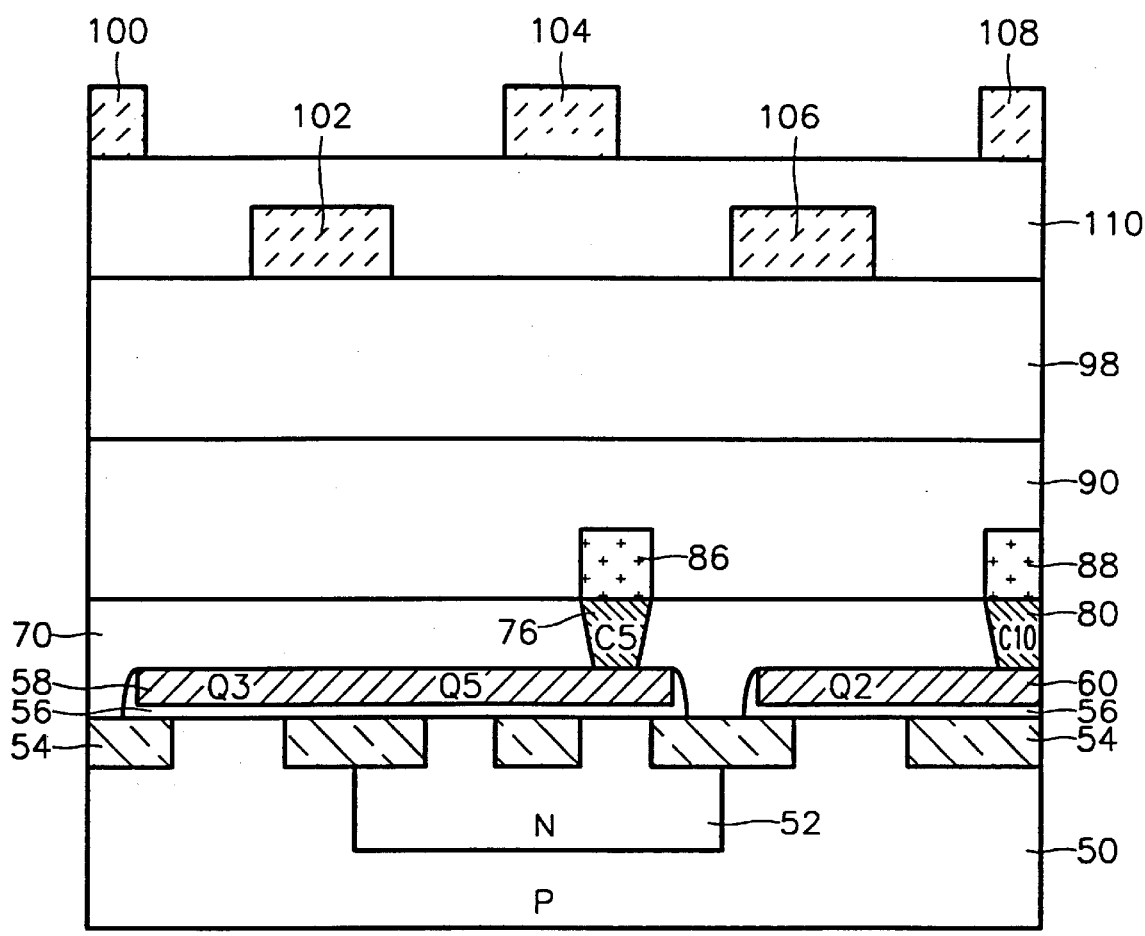
FIGS. 30 and 31 are sectional views taken along lines A–A' and B–B', respectively, in FIG. 29.
Figure 31:
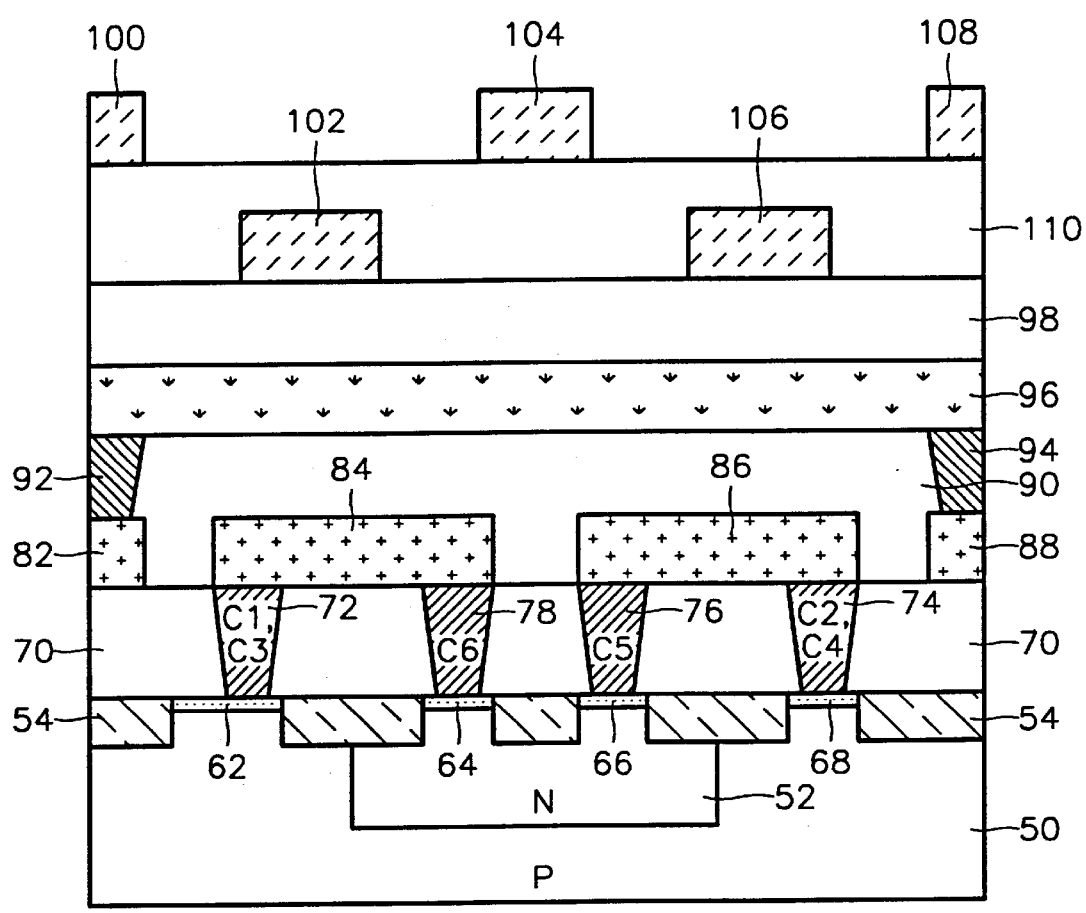

FIGS. 30 and 31, which are sectional views of the sections taken along the lines A–A' and B–B', respectively, in FIG. 29, show other embodiments of SRAM devices, formed using the mask patterns of FIGS. 3 through 7, and using the mask patterns of FIGS. 30 and 31, respectively.

As opposed to the first embodiment where the bit lines and the power supply lines are formed with metal in the same layer, the additional embodiment of the SRAM device has bit lines and power supply lines formed of metal in different layers as shown in FIGS. 30 and 31.

In other words, the first embodiment of the SRAM device includes three metal layers (a first metal layer including the first and second connection lines as a second conductive layer, a second metal layer including the word line as a third conductive layer, and a third metal layer including the power supply lines and bit lines as a fourth conductive layer), while the additional embodiment of the SRAM device includes four metal layers (a first metal layer including first and second connection lines 84 and 86, a second metal layer including a word line 96, and a third metal layer including first and second bit lines 102 and 106, and a fourth metal layer including a first power supply line 104 and second power supply lines 100 and 108). In FIGS. 30 and 31, reference number 110 represents a second ILD film.

In the manufacture of the SRAM devices according to the other embodiments of the present invention, kinds of metals used, the thickness of metal layers, and how to form the metal layers are similar to those illustrated in the formation of the first embodiment of the SRAM device.

In the SRAM devices and method for manufacturing the same according to the present invention, as opposed to the conventional technique in which an interconnection including Ti and TiN layers or an interconnection formed of W layer are used for interconnection between first and second inverters and strapping of word line, the present invention uses a metal connection, so that resistance of the metal connection (including three or four metal layers) can be decreased to between a tenth and a hundred, improving the operating speed of SRAM cells. Also, the SRAM manufacture according to the present invention can be performed simultaneously with CMOS standard logic manufacturing process, so that the formation of SRAM cells can be simplified without need for additional masks or processes.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A static random access memory (SRAM) device constituted of a flip-flop circuit including two access transistors and a pair of inverters, comprising:

a semiconductor substrate in which parallel first and second active regions of a first conductive type are arranged and third and fourth active regions of a second conductive type are arranged between the first and second active regions;

first conductive layers acting as the gates of the first access transistor and the first drive transistor which extend perpendicular to the first active region for serial connection between the first access and drive transistors, as the gates of the second access transistor and the second drive transistors which extend perpendicular to the second active region for serial connection between the second access and drive transistors, as the gate of the first load transistor which extends perpendicular to the third active region, and as the gate of the second load transistor which extends perpendicular to the fourth active region;

second conductive layers acting as a first connection line which connects the drain of the first access transistor and the first drive transistor, the gate of the second drive transistor, the gate of the second load transistor connected to the gate of the second drive transistor, and the source of the first load transistor, and as a second connection line which connects the drain of the second access transistor and the second drive transistor, the gate of the first drive transistor, the gate of the first load transistor connected to the gate of the first drive transistor, and the source of the second load transistor;

a third conductive layer acting as a word line connected to the gate of the first access transistor and the gate of the second access transistor; and fourth conductive layers acting as a first power supply line connected to the drain of the first load transistor and the drain of the second load transistor, as a second power supply line connected to the source of the first drive transistor and the source of the second drive transistor, as a first bit line connected to the source of the first access transistor, and as a second bit line connected to the source of the second access transistor.

2. The SRAM device of claim 1, wherein the first and second active regions are formed across a cell in a bar shape, and the third and fourth active regions are arranged in a staggered manner parallel to the first and second active regions.

3. The SRAM device of claim 1, wherein the first active region has a wider width at regions overlapped by the gate of the first drive transistor than at regions overlapped by the gate of the first access transistor, and the second active region has a wider width at regions overlapped by the gate of the second drive transistor than at regions overlapped by the gate of the second access transistor.

4. The SRAM device of claim 1, wherein the gate of the first drive transistor arranged perpendicular to the first active region and the gate of the first load transistor arranged perpendicular to the third active region are laterally connected to cover one end of the fourth active region, and the gate of the second drive transistor arranged perpendicular to the second active region and the gate of the second load transistor arranged perpendicular to the fourth active region are laterally connected to cover one end of the third active region.

5. The SRAM device of claim 4, wherein the gate of the first access transistor, the gate of the second drive transistor and the gate of the second load transistor are located in a line, and the gate of the second access transistor, the gate of the first drive transistor and the gate of the first load transistor are located in another line parallel to the gates of the first access transistor, second drive transistor and second load transistor.

6. The SRAM device of claim 1, wherein the first connection line and the second connection line are arranged, not overlapping each other, and the elements connected to the second connection line are not overlapped by the first connection line, and the elements connected to the first connection line are not overlapped by the second connection line.

7. The SRAM device of claim 4, wherein the first connection line connects the drain of the first access transistor and the first drive transistor, the gate of the second drive transistor, the gate of the second load transistor, and the source of the first load transistor via a contact hole C1/C3 formed on the drain of the first access transistor and the first drive transistor and a contact hole C6 formed over the gate of the second load transistor overlapped by the one end of the third active region, and the source of the first load transistor, and the second connection line connects the drain of the second access transistor and the second drive transistor, the gate of the first drive transistor, the gate of the first load transistor and the source of the second load transistor via a contact hole C2/C4 formed on the drain of the second access transistor and the second drive transistor and a contact hole C5 formed over the gate of the first load transistor overlapped by one end of the fourth active region, and the source of the second load transistor.

8. The SRAM device of claim 1, wherein the first and second connection lines are formed of polysilicon, amorphous silicon, aluminum (Al), tungsten (W), titanium (Ti), cobalt (Co) or copper (Cu).

9. The SRAM device of claim 1, wherein the word line is connected to a first pad layer C9 which is formed of the first conductive layer and is connected to the gate of the first access transistor, and a first pad layer C10 which is formed of the first conductive layer and is connected to the gate of the second access transistor.

10. The SRAM device of claim 1, wherein the word line is arranged parallel to the gates of the transistors and across a cell in a bar shape.

11. The SRAM device of claim 1, wherein the first power line, the second power line, the first bit line and the second bit line are arranged perpendicular to the word line.

12. The SRAM device of claim 1, wherein the first power supply line is arranged between and parallel to the first and second bit lines, and the second power supply lines are arranged between and parallel to the first and second bit lines between which the first power supply line is not formed.

13. The SRAM device of claim 12, wherein the first power supply line supplies the supplying power supply voltage to the drains of the first and second load transistors respectively via a first pad layer C12 formed of the second conductive layer over the drain of the first load transistor and via a second pad layer C12 formed of the third conductive layer over the drain of the second load transistor, and the second power supply line supplies ground voltage to the sources of the first and second drive transistors respectively via a first pad layer C11 formed of the second conductive layer over the source of the first drive transistor and via a second pad layer C11 formed of the third conductive layer over the source of the second drive transistor; and the first bit line supplies a bit line or bit line bar voltage to the source of the first access transistor via a first pad layer C7 formed of the second conductive layer and a first pad layer C7 formed of the third conductive layer over the source of the first access transistor, and the second bit line supplies a bit line bar or bit line voltage to the source of the second access transistor via a first pad layer C8 formed of the second conductive layer and a second pad layer C8 formed of the third conductive layer over the source of the second access transistor.

14. The SRAM device of claim 1, wherein the second through fourth conductive layers are a metal layer.

15. A method for manufacturing a static random access memory (SRAM) device constituted of a flip-flop including two access transistors and a pair of inverters, the method comprising:

defining first and second active regions in a semiconductor substrate parallel to each other, and simultaneously arranging third and fourth active regions between the first and second active regions parallel to each other;

forming a gate oxide layer on the substrate having the first through fourth active regions, and forming the gates of the first access transistor and the first drive transistor perpendicular to the first active region for serial connection between the first access transistor and the first drive transistor, the gates of the second access transistor and the second drive transistor perpendicular to the second active region for serial connection between the second access transistor and the second drive transistor, the gate of the first load transistor perpendicular to the third active region, and the gate of the second load transistor perpendicular to the fourth active region;

forming a first interlayer dielectric (ILD) film on the substrate having the gates of the transistors, and selectively etching the first ILD film to form a contact hole C1/C3 over the drain of the first access transistor and the first drive transistor, a contact hole C6 over the gate of the second load transistor and the source of the first load transistor connected to the gate of the second drive transistor, a contact hole C2/C4 over the drain of the second access transistor and the first drive transistor, and a contact hole C5 over the gate of the first load transistor and the source of the second load transistor connected to the gate of the first drive transistor;

forming a second conductive layer and selectively patterning the second conductive layer to form a first connection line for connecting the drains of the first access transistor and first drive transistor, the gates of the second drive transistor and second load transistor, and the source of the first load transistor via the contact holes C1/C3 and C6, and a second connection line for connecting the drains of the second access transistor and second drive transistor, the gates of the first drive transistor and first load transistor, and the source of the second load transistor via the contact holes C2/C4 and C5;

forming a second ILD film and selectively patterning the second ILD film to form a first via hole C9 over the gate of the first access transistor and a first via hole C10 over the gate of the second access transistor;

forming a third conductive layer and selectively patterning the third conductive layer to form a word line connected to the gates of the first access transistor and the second access transistor respectively via the first via holes C9 and C10;

forming a second ILD film and selectively patterning the second ILD film to form a second via hole C12 over the drain of the first and second load transistors, a second via hole C11 over the source of the first and second drive transistors, a second via hole C7 over the source of the first access transistor, and a second via hole C8 over the source of the second access transistor; and forming a fourth conductive layer and selectively patterning the fourth conductive layer to form a first power supply line connected to the drain of the first and second load transistors via the second via hole C12, a second power supply line connected to the source of the first and second drive transistors via the second via hole C11, a first bit line connected to the source of the first access transistor via the second via hole C7, and a second bit line connected to the source of the second access transistor via the second via hole C8.

16. The method of claim 15, wherein the first and second active regions are formed across a cell in a bar shape, and the third and fourth active regions are arranged in a staggered manner parallel to the first and second active regions.

17. The method of claim 18, wherein the first active region has a wider width at regions overlapped by the gate of the first drive transistor than at regions overlapped by the gate of the first access transistor, and the second active region has a wider width at regions overlapped by the gate of the second drive transistor than at regions overlapped by the gate of the second access transistor.

18. The method of claim 15, wherein in forming the contact holes in the first ILD film along with the contact holes C/C3, C2/C4, C5 and C6, contact holes C7 and C9 are respectively formed over the source and gate of the first access transistor, contact holes C11 are formed over the sources of the first and second drive transistors, contact holes C8 and C10 are respectively formed over the source and gate of the second access transistor, and contact holes C12 are formed over the drains of the first and second load transistors.

19. The method of claim 15, before forming the second conductive layer, further comprising depositing tungsten to fill the contact holes C1/C2, C2/C4, C5 and C6, and planarizing the tungsten layer until the surface of the first ILD film is exposed, to form a first plug C1/C3 filling the contact hole C1/C3, a first plug C2/C4 filling the contact hole C2/C4, a first plug C5 filling the contact hole C5, and a first plug C6 filling the contact plug C6.

20. The method of claim 19, wherein along with the first plugs C1/C3, C2/C4, C5 and C6, first plugs C7 and C9 are respectively formed in the contact holes C7 and C9 formed respectively over the source and gate of the first access transistor, first plugs C11 are formed in the contact holes C11 formed respectively over the sources of the first and second drive transistors, first plugs C8 and C10 are respectively formed in the contact holes C8 and C10 formed respectively over the source and gate of the second access transistor; and first plugs C12 are formed in the contact holes C12 formed over the drains of the first and second load transistors.

21. The method of claim 20, wherein in patterning the second conductive layer along with the first and second connection lines a first pad layer C7 connected to the first plug C7, a first pad layer C9 connected to the first plug C9, a first pad layer C11 connected to the first plug 11, a first pad layer C8 connected to the first plug C8, a first pad layer C10 connected to the first plug C10, and a first pad layer C12 connected to the first plug C12 are formed.

22. The method of claim 15, wherein the second conductive layer is formed of polysilicon, amorphous silicon, aluminum (Al), tungsten (W), titanium (Ti), cobalt (Co) or copper (Cu), and the third and fourth conductive layers are formed of Al or Cu.

23. The method of claim 15, wherein the contact holes, the first via holes and the second via holes are filled with tungsten to form first plugs, second plugs and third plugs, respectively.

24. The method of claim 15, wherein in defining the active regions, each step for forming fourth conductive layers are accompanied with general CMOS manufacturing process.

25. A static random memory device (SRAM) constituted of a flip-flop circuit including two access transistors and a pair of inverters, comprising:

a semiconductor substrate in which parallel first and second active regions of a first conductive type are arranged and third and fourth active regions of a second conductive type are arranged between the first and second active regions;

first conductive layers acting as the gates of the first access transistor and the first drive transistor which extend perpendicular to the first active region for serial connection between the first access and drive transistors, as the gates of the second access transistor and the second drive transistors which extend perpendicular to the second active region for serial connection between the second access and drive transistors, as the gate of the first load transistor which extends perpendicular to the third active region, and as the gate of the second load transistor which extends perpendicular to the fourth active region;

second conductive layers formed of a metal layer acting as a first connection line which connects the drain of the first access transistor and the first drive transistor, the gate of the second drive transistor, the gate of the second load transistor connected to the gate of the second drive transistor, and the source of the first load transistor, and as a second connection line which connects the drain of the second access transistor and the second drive transistor, the gate of the first drive transistor, the gate of the first load transistor connected to the gate of the first drive transistor, and the source of the second load transistor;

a third conductive layer formed of a metal layer, acting as a word line connected to the gate of the first access transistor and the gate of the second access transistor; and fourth conductive layers formed of a metal layer, acting as a first bit line connected to the source of the first access transistor and as a second bit line connected to the source of the second access transistor; and fifth conductive layers formed of a metal layer, acting as a first power supply line connected to the drain of the first and second load transistors, and as a second power supply line connected to the source of the first and second drive transistors.

* * * * *

UNITED STATES PATENT AND TRADEMARK OFFICE
CERTIFICATE OF CORRECTION

PATENT NO. : 6,417,549 B1  Page 1 of 1
APPLICATION NO. : 09/660571
DATED : July 9, 2002
INVENTOR(S) : Chang-bong Oh It is certified that error appears in the above-identified patent and that said Letters Patent is hereby corrected as shown below:

Column 6, line 37 delete "the first drive transistor" and insert --the second drive transistor--
Column 6, line 57 delete "a second ILD film" and insert --a third ILD film--
Column 7, line 17 delete "holes C/C3" and insert --holes C1/C3--
Column 7, line 27 delete "C1/C2" and insert --C1/C3--
Column 22, line 50 delete "the first drive transistor" and insert --the second drive transistor--
Column 23, line 8 delete "a second ILD film" and insert --a third ILD film--
Column 23, line 9 delete "a second ILD film" and insert --a third ILD film--
Column 23, line 38 delete "holes C/C3" and insert --holes C1/C3--
Column 23, line 48 delete "holes C1/C2" and insert --holes C1/C3--

Signed and Sealed this

Eighteenth Day of October, 2011

David J. Kappos
*Director of the United States Patent and Trademark Office*